(12) United States Patent
Kim

(10) Patent No.: US 9,761,710 B2
(45) Date of Patent: Sep. 12, 2017

(54) VERTICAL-CHANNEL SEMICONDUCTOR DEVICE

(71) Applicant: SK hynix Inc., Icheon (KR)

(72) Inventor: Seung Hwan Kim, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/679,959

(22) Filed: Apr. 6, 2015

(65) Prior Publication Data

US 2016/0104798 A1    Apr. 14, 2016

(30) Foreign Application Priority Data

Oct. 10, 2014 (KR) .................. 10-2014-0136638

(51) Int. Cl.
| | |
|---|---|
| H01L 29/94 | (2006.01) |
| H01L 29/78 | (2006.01) |
| H01L 29/10 | (2006.01) |
| H01L 29/423 | (2006.01) |
| H01L 29/06 | (2006.01) |
| H01L 27/108 | (2006.01) |

(52) U.S. Cl.
CPC .... *H01L 29/7827* (2013.01); *H01L 27/10823* (2013.01); *H01L 27/10876* (2013.01); *H01L 27/10885* (2013.01); *H01L 29/0649* (2013.01); *H01L 29/1037* (2013.01); *H01L 29/42356* (2013.01)

(58) Field of Classification Search
None
See application file for complete search history.

(56) References Cited

U.S. PATENT DOCUMENTS

| | | | |
|---|---|---|---|
| 2011/0156134 A1* | 6/2011 | Kim | ................. H01L 21/26506 257/329 |
| 2011/0227145 A1* | 9/2011 | Renn | ................. H01L 27/10823 257/328 |
| 2013/0099305 A1 | 4/2013 | Kim et al. | |
| 2013/0105872 A1 | 5/2013 | Kim et al. | |
| 2013/0161710 A1* | 6/2013 | Ji | ..................... H01L 29/66666 257/296 |
| 2014/0061746 A1 | 3/2014 | Cho et al. | |
| 2015/0008495 A1 | 1/2015 | Kim et al. | |

FOREIGN PATENT DOCUMENTS

| | | |
|---|---|---|
| KR | 10-2013-0042779 A | 4/2013 |
| KR | 10-2013-0047410 A | 5/2013 |
| KR | 10-2013-0111728 A | 10/2013 |
| KR | 10-2014-0028371 A | 3/2014 |

* cited by examiner

*Primary Examiner* — Earl Taylor
*Assistant Examiner* — Samuel Park

(57) ABSTRACT

A vertical-channel semiconductor device having a buried bit line is disclosed. The vertical-channel semiconductor device enables an active pillar including a vertical channel region to be separate from a substrate, couples the active pillar to the substrate using a body-tied structure, and prevents a floating body effect from occurring therein. In addition, the vertical-channel semiconductor device includes an air gap between buried bit lines to reduce parasitic capacitance between the bit lines.

16 Claims, 46 Drawing Sheets

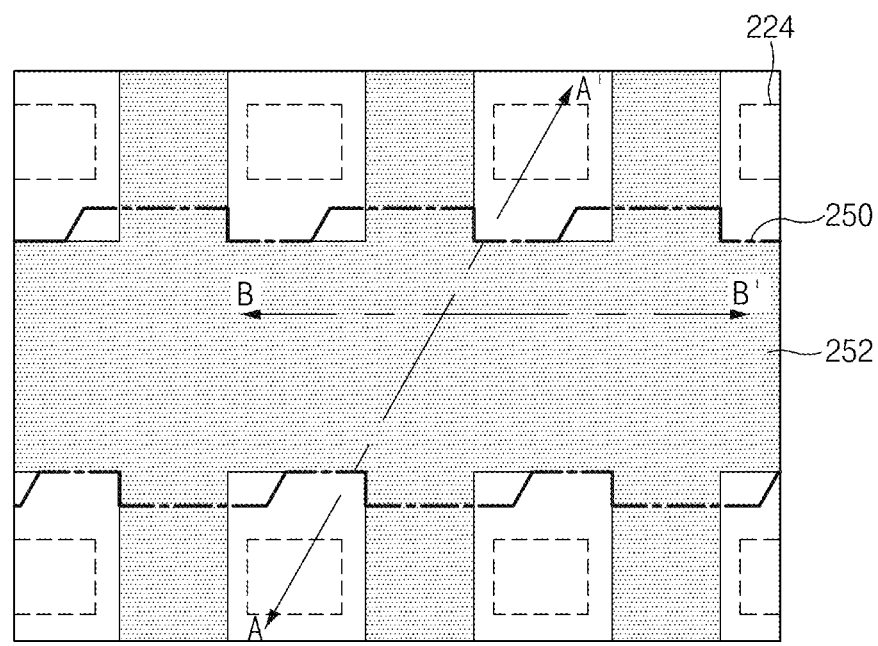
F I G. 15A

VERTICAL-CHANNEL SEMICONDUCTOR DEVICE

CROSS-REFERENCE TO RELATED APPLICATION

The priority of Korean Patent Application No. 10-2014-0136638, filed on 10 Oct. 2014, the disclosure of which is hereby incorporated in its entirety by reference, is claimed.

BACKGROUND

Embodiments of the present disclosure relate to a semiconductor device, and more particularly to a vertical-channel semiconductor device including a buried bit line.

As the degree of integration of a semiconductor device increases, the size of a memory cell is gradually reduced and thus a channel length of a metal oxide semiconductor field effect transistor (MOSFET) included in the semiconductor device is also gradually reduced. As a distance between conductive structures is gradually reduced, parasitic capacitance is gradually increased. As a result, characteristics of the semiconductor device are deteriorated.

BRIEF SUMMARY

Various embodiments of the present disclosure are directed to a vertical-channel semiconductor device that substantially obviates one or more problems due to limitations and disadvantages of the related art.

An embodiment of the present disclosure relates to a semiconductor device capable of preventing the occurrence of a floating body effect as well as reducing parasitic capacitance between neighboring bit lines.

In accordance with an aspect of the present invention, a semiconductor device includes: a first active pillar and a second active pillar, having a channel region arranged in a direction perpendicular to a major surface of a substrate; an insulation film defining the first active pillar and the second active pillar, and separating the first active pillar and the second active pillar from the substrate; a first gate disposed between the first active pillar and the second active pillar, and disposed over a lateral surface of the first active pillar; a second gate disposed between the first active pillar and the second active pillar, and located at a lateral surface of the second active pillar; and a bit line disposed below the first gate and the second gate, and coupled to and disposed between the first active pillar and the second active pillar.

In accordance with another aspect of the present invention, a semiconductor device includes: an active pillar being separated from a substrate; a gate disposed over a lateral surface of the active pillar; an insulation film separating the active pillar from the substrate; a buried bit line disposed between the insulation film and the gate, and coupled to a lower portion of the active pillar; and a body-tied structure having a pillar shape, and coupling the active pillar to the substrate.

In accordance with another aspect of the present invention, a semiconductor device includes: an active pillar being separated from a substrate by an insulation film; a gate disposed over a lateral surface of the active pillar; a buried bit line disposed between the insulation film and the gate, and coupled to a lower portion of the active pillar; a body-tied structure coupling the active pillar to the substrate; and a first air-gap disposed between the body-tied structure and the active pillar.

In accordance with an aspect of the present invention, a system includes: a central processing unit (CPU) configured to perform data processing; a main memory unit configured to store data to be processed by the CPU or to store data processed by the CPU; a storage unit coupled to the main memory unit, and configured to store data to be processed by the main memory unit or data processed by the CPU; and a control unit configured to control transmission of data or signals among the CPU, the main memory unit, and the storage unit, wherein the main memory unit includes: a first active pillar and a second active pillar, each having a channel region arranged in a direction perpendicular to a major surface of a substrate; an insulation film defining the first active pillar and the second active pillar, and separating the first active pillar and the second active pillar from the substrate; a first gate disposed between the first active pillar and the second active pillar, and disposed over a lateral surface of the first active pillar; a second gate disposed between the first active pillar and the second active pillar, and disposed over a lateral surface of the second active pillar; and a bit line disposed below the first gate and the second gate, and coupled to and disposed between the first active pillar and the second active pillar.

In accordance with an aspect of the present invention, an electronic device includes: a processor configured to perform data processing; a DRAM configured to store data to be processed by the processor; an interface unit configured to perform data or signal transmission between the processor and an external device; and an output unit configured to output data processed by the processor to an output device, wherein the DRAM includes: a first active pillar and a second active pillar, each having a channel region arranged in a direction perpendicular to a major surface of a substrate; an insulation film defining the first active pillar and the second active pillar, and separating the first active pillar and the second active pillar from the substrate; a first gate disposed between the first active pillar and the second active pillar, and disposed over a lateral surface of the first active pillar; a second gate disposed between the first active pillar and the second active pillar, and disposed over a lateral surface of the second active pillar; and a bit line disposed below the first gate and the second gate, and coupled to and disposed between the first active pillar and the second active pillar.

In accordance with an aspect of the present invention, a solid state disc (SSD) includes: a non-volatile memory configured to store data in response to a control signal and to output stored data; a buffer memory configured to temporarily store data being input to or output from the non-volatile memory; and a memory controller configured to control data input/output (I/O) operations for the non-volatile memory and the buffer memory in response to a command from an external device, wherein the buffer memory includes: a first active pillar and a second active pillar, each having a channel region arranged in a direction perpendicular to a major surface of a substrate; an insulation film defining the first active pillar and the second active pillar, and separating the first active pillar and the second active pillar from the substrate; a first gate disposed between the first active pillar and the second active pillar, and disposed over a lateral surface of the first active pillar; a second gate disposed between the first active pillar and the second active pillar, and disposed over a lateral surface of the second active pillar; and a bit line disposed below the first gate and the second gate, and coupled to and disposed between the first active pillar and the second active pillar.

In accordance with an aspect of the present invention, an electronic device includes: a processor configured to perform data processing, and to control operations of the electronic device; a DRAM configured to store data to be processed by the processor or to store data processed by the processor; and an interface unit configured to exchange a control signal or data with an external device, wherein the DRAM includes: a first active pillar and a second active pillar, each having a channel region arranged in a direction perpendicular to a major surface of a substrate; an insulation film defining the first active pillar and the second active pillar, and separating the first active pillar and the second active pillar from the substrate; a first gate disposed between the first active pillar and the second active pillar, and disposed over a lateral surface of the first active pillar; a second gate disposed between the first active pillar and the second active pillar, and disposed over a lateral surface of the second active pillar; and a bit line disposed below the first gate and the second gate, and coupled to and disposed between the first active pillar and the second active pillar.

It is to be understood that both the foregoing general description and the following detailed description of embodiments are exemplary and explanatory.

BRIEF DESCRIPTION OF THE DRAWINGS

FIGS. 2A, 3A, 4A, 5A, 6A, 7A, 8A, 9A, 10A, 11A, 12A, 13A, 14A, 15A, 16A, 17A, and 18A are plan views illustrating processing steps for forming a semiconductor device according to an embodiment.

DESCRIPTION OF EMBODIMENTS

Figure 1A:
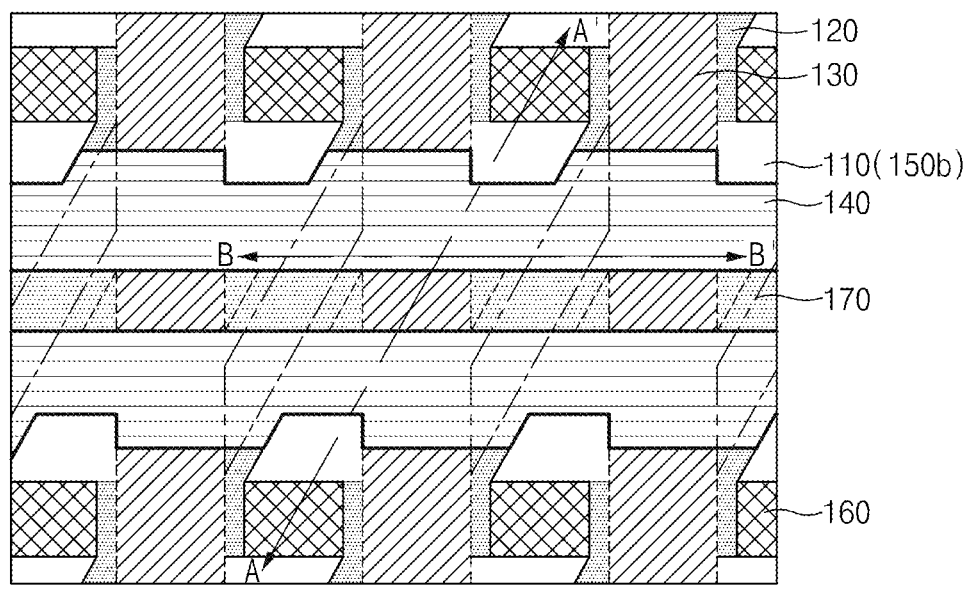
FIG. 1A is a plan view illustrating a semiconductor device according to an embodiment.

Reference will now be made in detail to embodiments of the present invention, examples of which are illustrated in the accompanying drawings. Wherever possible, the same reference numbers will be used throughout the drawings to refer to the same or like parts.

Most of semiconductor devices include transistor(s). For example, a memory cell for use in a semiconductor device such as a DRAM device may include a cell transistor such as a MOSFET. Generally, a planar-channel MOSFET includes junction regions (e.g., a source region and a drain region) formed in a semiconductor substrate and a planar channel disposed between the junction regions.

However, as the degree of integration of a semiconductor device increases, a channel area of a transistor is gradually reduced and thus a vertical channel for obviating the problems encountered by reduction of the channel area has been proposed. In a semiconductor device including a vertical channel, i.e., a vertical-channel semiconductor device, junction regions, e.g., a source region and a drain region, are formed at an upper portion and a lower portion of an active pillar, respectively. A vertical gate is formed on a sidewall of the active pillar, and thus a vertical channel is formed between the source region and the drain region in a direction perpendicular to a major surface, e.g., a top surface, of a substrate, i.e., a vertical direction.

However, as the active pillar is also gradually reduced in size, a channel region is isolated from a body of the substrate by a junction region (e.g., $N^+$ region), so that there occurs a floating body effect in which holes generated during an operation of a cell transistor are accumulated in the channel region without leaking out to the body. As a result, a potential of the channel region continuously increases.

In addition, as the degree of integration of the semiconductor device increases, a distance between conductive structures is gradually reduced, and thus a problem caused by parasitic capacitance occurs. In order to address this problem, a material of an insulation film may be changed or an air gap may be added.

Reference will now be made in detail to certain embodiments, examples which are illustrated in the accompanying drawings. Prior to description, terms or words used in the disclosure and claims are not interpreted as having general meanings or dictionary meanings, but should be interpreted as having meanings and concepts coinciding with the technical scope and sprit of the present invention based on the principle in that an inventor may properly define the concept of terms to describe the present invention in the best mode. Therefore, the embodiments described in the specification and shown in the drawings are purely illustrative and are not intended to represent all aspects of the invention, such that various equivalents and modifications may be made without departing from the spirit of the invention.

Figure 1B:
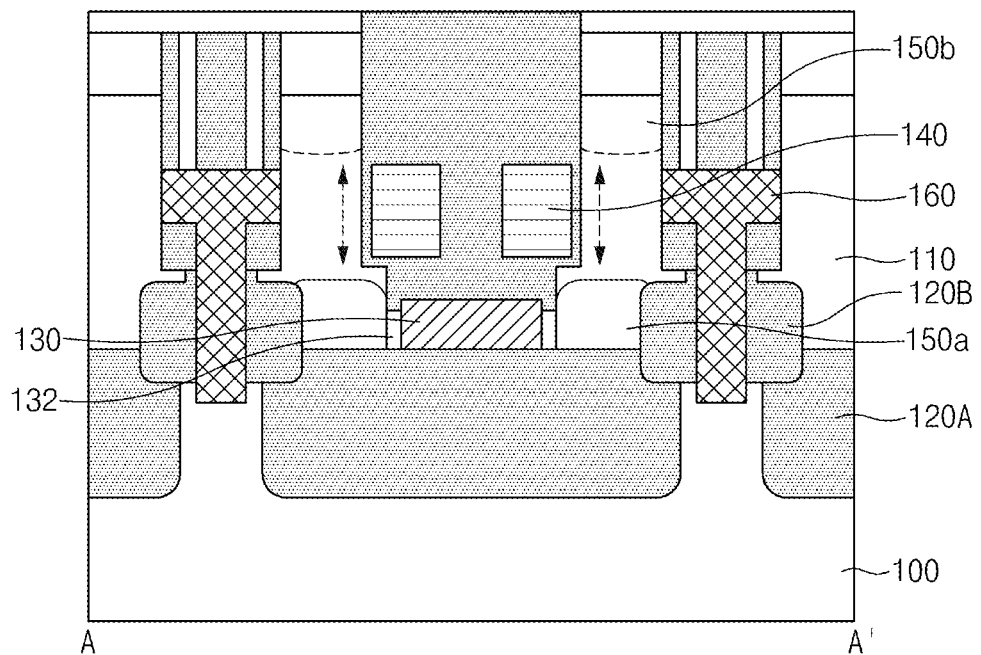
FIG. 1B is a cross-sectional view illustrating the semiconductor device taken along a line A-A' of FIG. 1A.
Figure 1C:
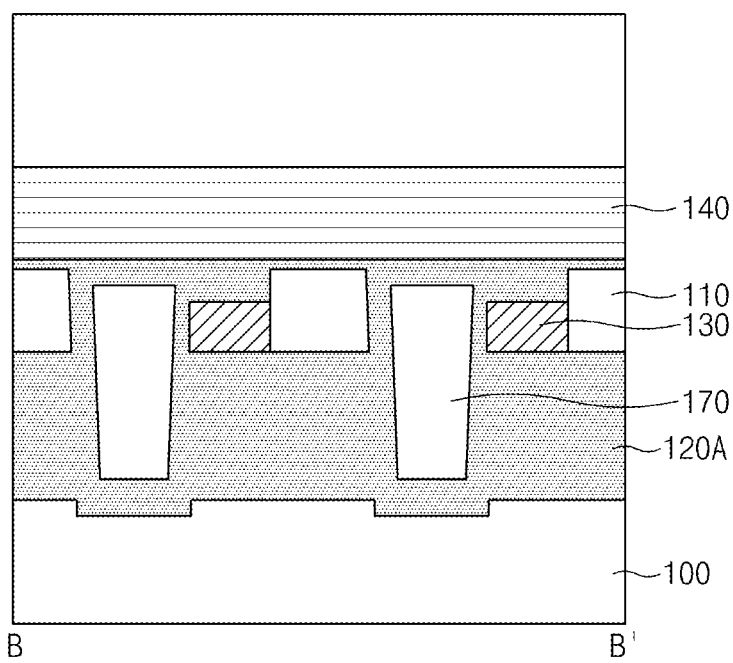
FIG. 1C is a cross-sectional view illustrating the semiconductor device taken along a line B-B' of FIG. 1A.

FIG. 1A is a plan view illustrating a semiconductor device according to an embodiment. FIG. 1B is a cross-sectional view illustrating the semiconductor device taken along a line A-A' of FIG. 1A. FIG. 1C is a cross-sectional view illustrating the semiconductor device taken along a line B-B' of FIG. 1A. With respect to the orientation of the figure, the line A-A' obliquely cuts the semiconductor device of FIG. 1A, and the line B-B' horizontally cuts the semiconductor device of FIG. 1A.

Referring to FIGS. 1A, 1B, and 1C, an active pillar 110 is formed by etching a semiconductor substrate 100 and includes therein a vertical channel region denoted by an arrow of FIG. 1B. The semiconductor substrate 100 may include a silicon-based material. In an embodiment, the semiconductor substrate 100 may include a monocrystalline silicon substrate. Since the active pillar 110 is formed by etching the semiconductor substrate 100, the semiconductor substrate 100 and the active pillar 110 may have the same material. Accordingly, the active pillar 110 may also include a silicon-based material such as a monocrystalline silicon material.

The active pillars 110 may be defined by a plurality of device isolation films 120. The active pillars 110 may correspond to both ends of active regions isolated from each other by etching central parts of the active regions. The active regions are arranged in parallel in a line shape by a line-type device isolation film that is formed between two neighboring line-type active regions. Therefore, the line-type device isolation film and the line-type active region extend in a first direction corresponding to the line A-A'.

Specifically, referring to FIG. 1B, the device isolation films 120 may include a first device isolation film 120A formed below the active pillars 110 and a second device isolation film 120B disposed at a side of a lower portion of the active pillar 110. Therefore, the active pillars 110 may be isolated and floated from the substrate 100 by the device isolation films 120 in the same manner as in a Silicon On Insulator (SOI) structure. Each device isolation film 120 may include an oxide film.

A body-tied structure 160 for coupling corresponding active pillars 110 to the substrate 100 is formed between two neighboring active pillars 110. The body-tied structure 160 is used to prevent a floating body effect in such a manner that holes generated during an operation of a cell transistor are leaked out to the substrate 100. The body-tied structure 160 may be formed in a pillar shape between the two neighboring active pillars 110 so that the body-tied structure 160 can be commonly coupled to the two neighboring active pillars 110. A lower end of the body-tied structure 160 is coupled to the semiconductor substrate 100, and an upper end of the body-tied structure 160 is commonly coupled to sidewalls of the two neighboring active pillars 110. This body-tied structure 160 may include doped polysilicon.

Referring to FIGS. 1A and 1B, three sides, e.g., first, second, and third sides, of each of the active pillars 110 are enclosed by a gate 140, and junction regions 150a and 150b are respectively formed under and over the vertical channel region. That is, one sidewall of the active pillar 110 is coupled to the body-tied structure 160, and the remaining sidewalls other than the one sidewall are enclosed by the gate 140. Accordingly, holes generated in the vertical channel region during the operation of the cell transistor can be leaked out to the substrate 100 via the body-tied structure 160. As a result, the floating body effect is prevented from occurring in the cell transistor, and an operation current of the cell transistor can be sufficiently acquired.

In this embodiment, a buried bit line (BBL) 130 is located below the gate 140 and disposed between the active pillars 110 in such a manner that the buried bit line 130 extends in a direction crossing an extending direction of the gate 140 that corresponds to the line B-B' in a plan view of FIG. 1A. As described above, the buried bit line 130 is disposed below the gate 140 so that a distance between the buried bit line 130 and a storage node (not shown), which may be disposed over the gate 140, is sufficiently elongated, and thus parasitic capacitance between the buried bit line 130 and the storage node can be reduced.

A bit line contact 132 is formed at both sides of the buried bit line 130, and the bit line contact 132 couples the buried bit line 130 to the bit line junction region 150a formed in a lower portion of the active pillar 110. That is, the buried bit line 130 may have a Both Side Contact (BSC) structure commonly coupled to the junction regions 150a of the active pillars 110 located at both sides thereof. In an embodiment, the buried bit line 130 may include a metallic material, e.g., tungsten. The bit line contact 132 may include a silicide film.

In addition, an air gap 170 is formed in the device isolation film 120 between two neighboring buried bit lines 130. Therefore, parasitic capacitance between the buried bit lines 130 can be more reduced than in the case in which the device isolation film 120 is composed of an oxide film (or a nitride film) only.

For convenience of description and better understanding of the present invention, insulation films formed over the buried bit line 130, the gate 140, and the body-tied structure 160 are not shown in FIG. 1A.

FIG. 2A to FIG. 15A are plan views illustrating processing steps for forming a semiconductor device shown according to an embodiment. FIG. 2B to FIG. 15B are cross-sectional views illustrating the semiconductor device taken along lines A-A' of FIG. 2A to FIG. 15A, respectively. FIG. 2C to FIG. 15C are cross-sectional views illustrating the semiconductor device taken along lines B-B' of FIG. 2A to FIG. 15A, respectively.

Figure 2A:
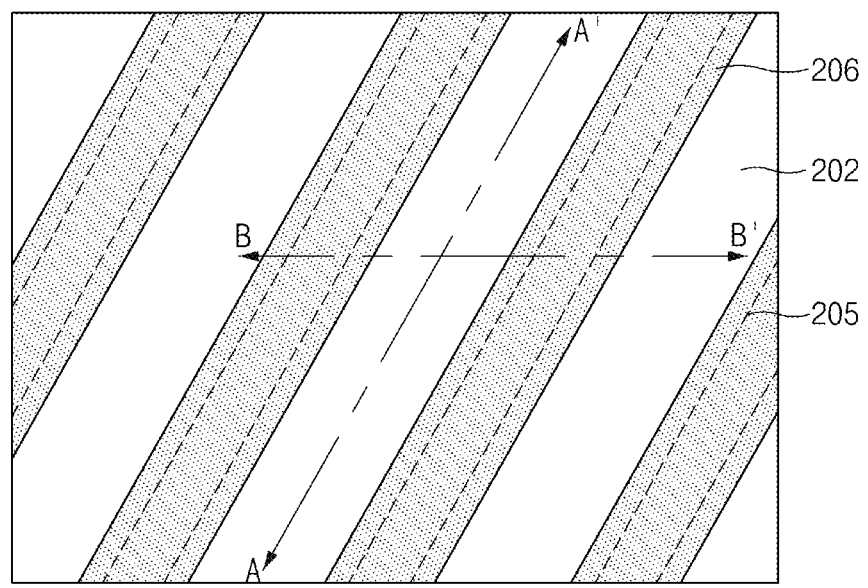
Figure 2B:
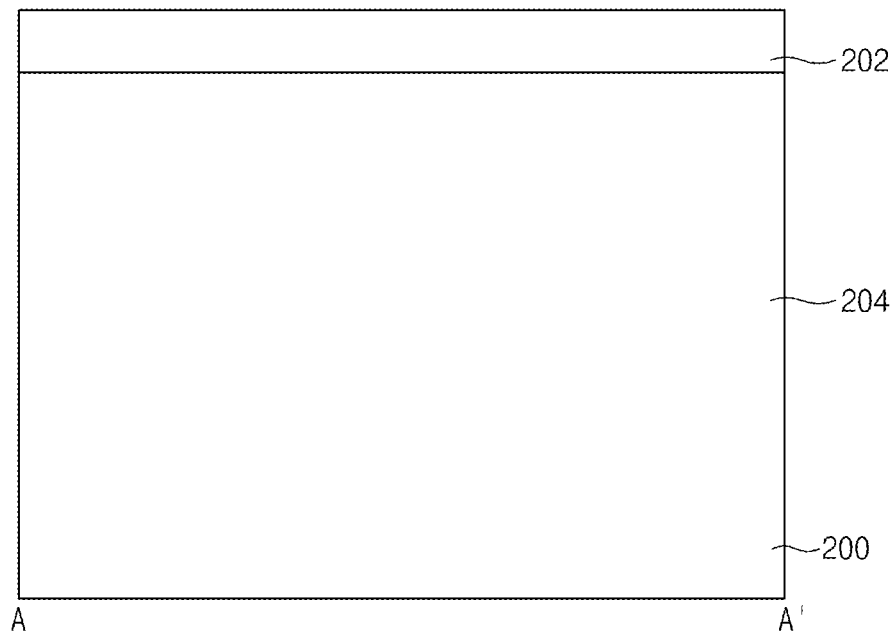
FIGS. 2B, 3B, 4B, 5B, 6B, 7B, 8B, 9B, 10B, 11B, 12B, 13B, 14B, 15B, 16B, 17B, and 18B are cross-sectional views illustrating the semiconductor device taken along lines A-A' of FIGS. 2A, 3A, 4A, 5A, 6A, 7A, 8A, 9A, 10A, 11A, 12A, 13A, 14A, 15A, 16A, 17A, and 18A, respectively.
Figure 2C:
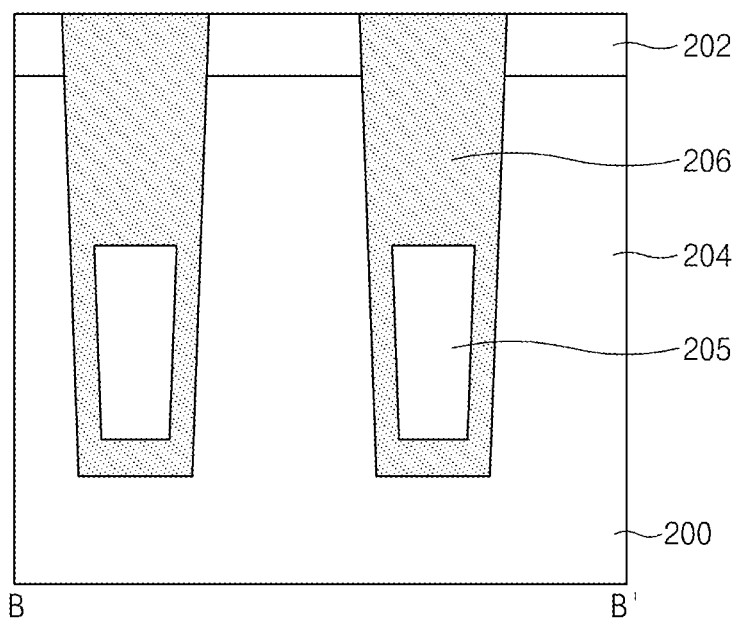
FIGS. 2C, 3C, 4C, 5C, 6C, 7C, 8C, 9C, 10C, 11C, 12C, 13C, 14C, 15C, 16C, 17C, and 18C are cross-sectional views illustrating the semiconductor device taken along lines B-B' of FIGS. 2A, 3A, 4A, 5A, 6A, 7A, 8A, 9A, 10A, 11A, 12A, 13A, 14A, 15A, 16A, 17A, and 18A, respectively.

Referring to FIGS. 2A, 2B, and 2C, a pad oxide film (not shown) and a pad nitride film (not shown) are formed over a semiconductor substrate 200, and a hard mask layer (not shown) is formed over the pad nitride film. In an embodiment, the hard mask layer may include a nitride film. Impurities for forming a junction region may be implanted into the substrate 200 before formation of the pad oxide film.

An ISO mask pattern (not shown) for defining an obliquely-tilted line-type active region is formed over the hard mask layer. Subsequently, the hard mask layer is etched using the ISO mask pattern as an etch mask, resulting in formation of a hard mask pattern 202 having a line shape. In an embodiment, the ISO mask pattern may be formed by Spacer Pattern Technology (SPT). Thereafter, the pad oxide film, the pad nitride film, and the semiconductor substrate 200 are sequentially etched using the hard mask pattern 202 as an etch mask, resulting in formation of a first device isolation trench (not shown) for defining a line-type active region 204.

Then, an insulation film (e.g., high temperature oxide (HTO)) is formed on sidewalls and bottom of the first device isolation trench. Subsequently, a sacrificial film 205 is formed to fill the first device isolation trench and then etched back, so that the sacrificial film 205 remains only at a lower portion of the first device isolation trench. The sacrificial film 205 is removed in a subsequent process, and an air gap is formed in a region from which the sacrificial film 205 is removed. The process of forming the air gap will be described later. In an embodiment, the sacrificial film 205 may include a silicon germanium (SiGe) material.

Subsequently, an insulation film for device isolation (i.e., a device isolation insulation film) fills the remaining portion of the first device isolation trench, and the device isolation insulation film is planarized until the hard mask pattern 202 is exposed, so that a device isolation film 206 defining the line-type active region 204 is formed. In an embodiment, the device isolation film 206 may include a Spin On Dielectric (SOD) material having superior gapfill characteristics, or include a High Density Plasma (HDP) oxide film. In an embodiment, the insulation film formed on the sidewalls and bottom of the first device isolation trench may have the same material as that of the device isolation film 206.

Figure 3A:
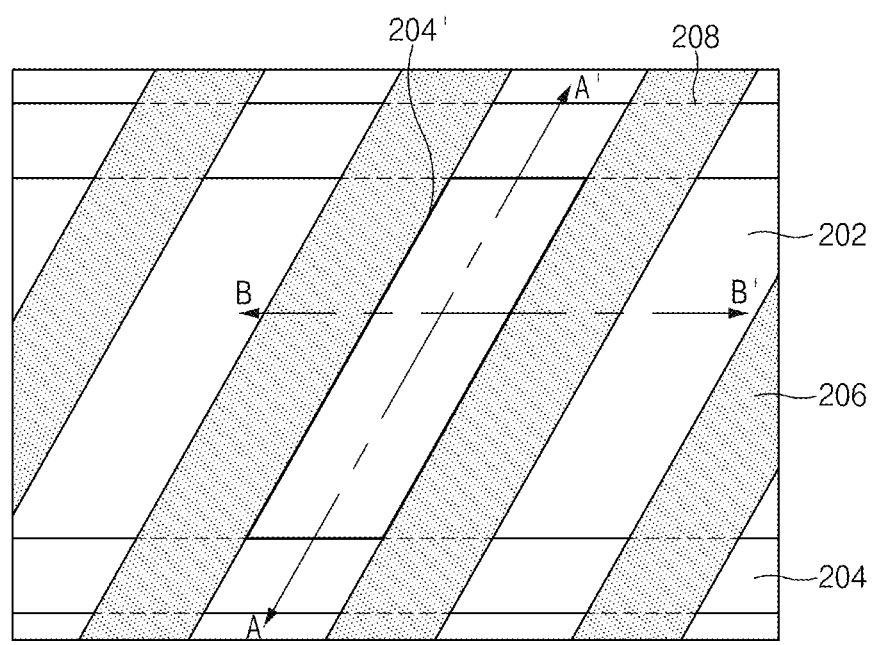
Figure 3B:
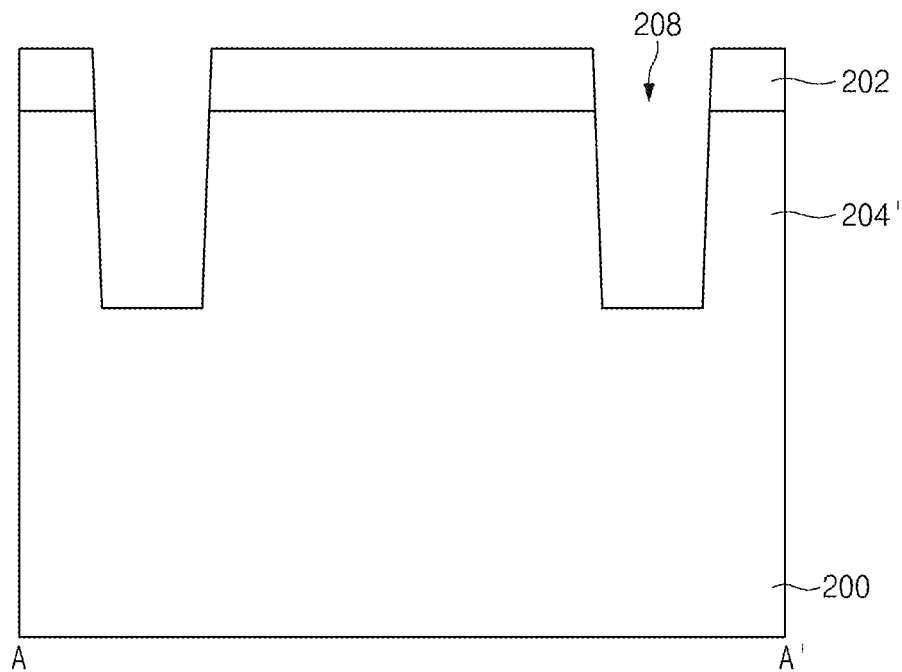
Figure 3C:
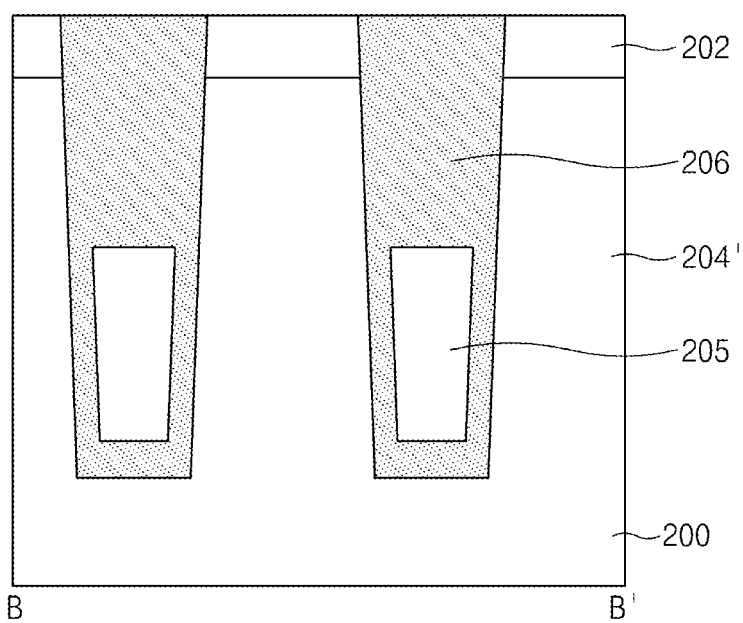

Referring to FIGS. 3A, 3B, and 3C, the hard mask pattern 202, the active region 204, and the device isolation film 206 are etched using an ISO cut mask extending in a second direction crossing an extending direction of the device isolation film 206, resulting in formation of a second device isolation trench 208 in a line shape. In an embodiment, the second device isolation trench 208 extends in a direction crossing the first device isolation trench and a buried bit line to be formed in a subsequent process. In an embodiment, the second direction corresponds to the line B-B' and orthogonally crosses the buried bit line.

By the second device isolation trench 208, the line-type active region 204 is divided into a plurality of island-type active regions 204' each having a predetermined length in the first direction. The island-type active regions 204' are arranged in parallel in an extending direction of the second device isolation trench 208, i.e., the second direction. That is, the island-type active regions 204' are not arranged in a zigzag pattern as in the conventional $8F^2$ or $6F^2$ structure. In an embodiment, a depth of the second device insolation trench 208 is smaller than that of the first device isolation trench.

Figure 4A:
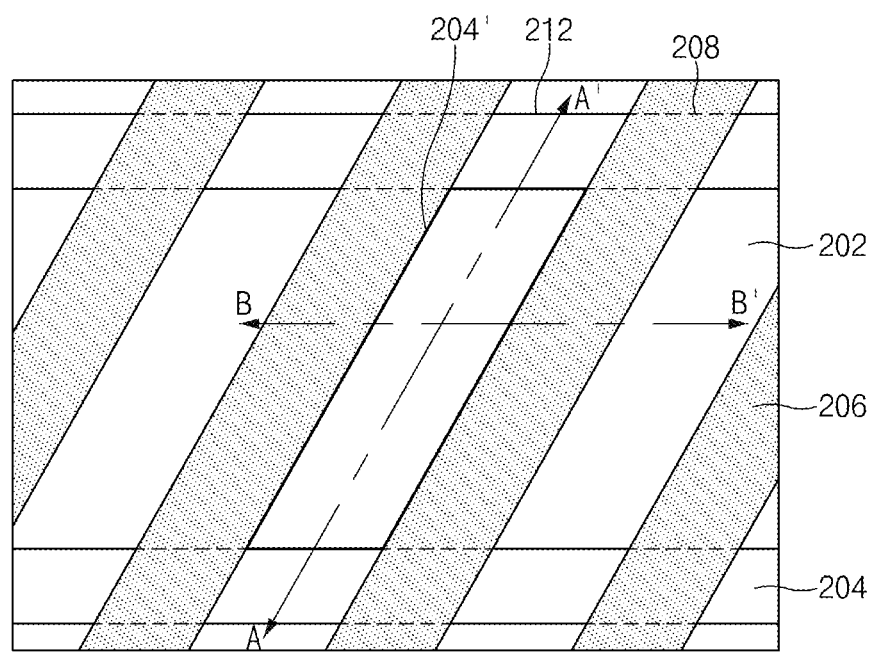
Figure 4B:
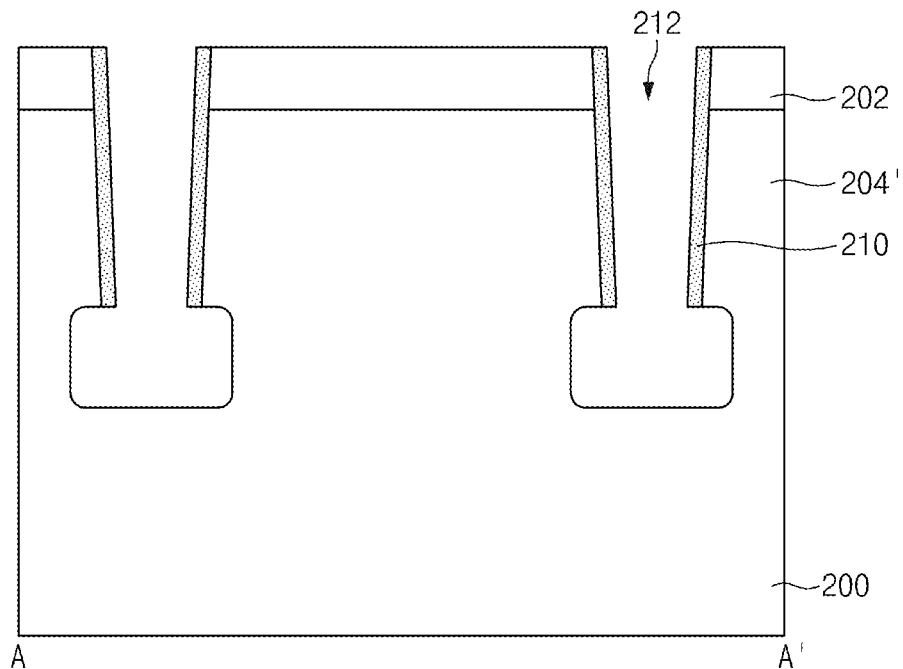
Figure 4C:
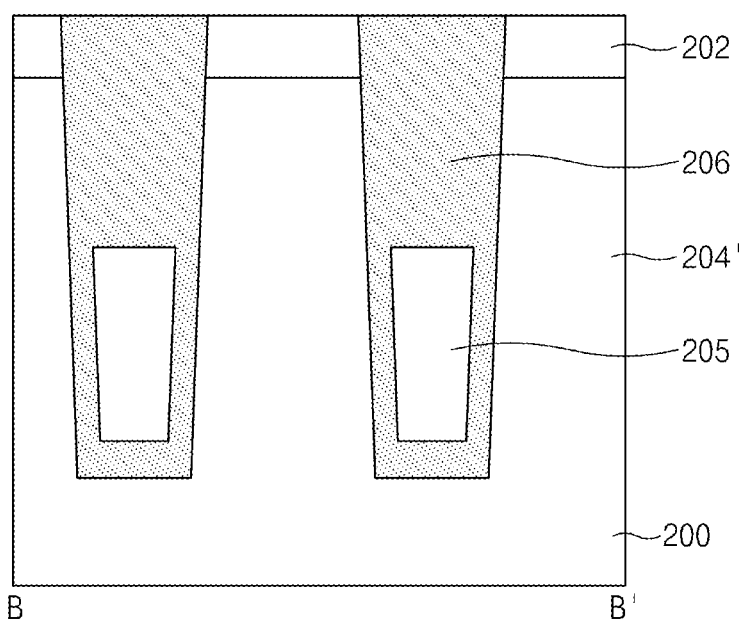

Referring to FIGS. 4A, 4B, and 4C, a spacer 210 is formed on sidewalls of the second device isolation trench 208. For example, an insulation film is deposited along a profile of a resultant structure of FIGS. 3A, 3B, and 3C, and is etched back, so that the spacer 210 is formed on the sidewalls of the second device isolation trench 208. In an embodiment, the spacer 210 may include an oxide film. In FIG. 4A, the spacer 210 is omitted for the simplicity of figures.

Subsequently, the active region 204 located below the second device isolation trench 208 is secondarily etched in a bulb shape using the spacer 210 as a barrier film, resulting in formation of a trench 212 having a cross section of a rounded bottom flask shape. The width of the rounded bottom is wider than its neck (e.g., the trench 212). In this case, the active region 204 located below the second device isolation trench 208 may be selectively etched in a bulb shape using the etch selectivity of the active region 204 and the device isolation film 206.

Figure 5A:
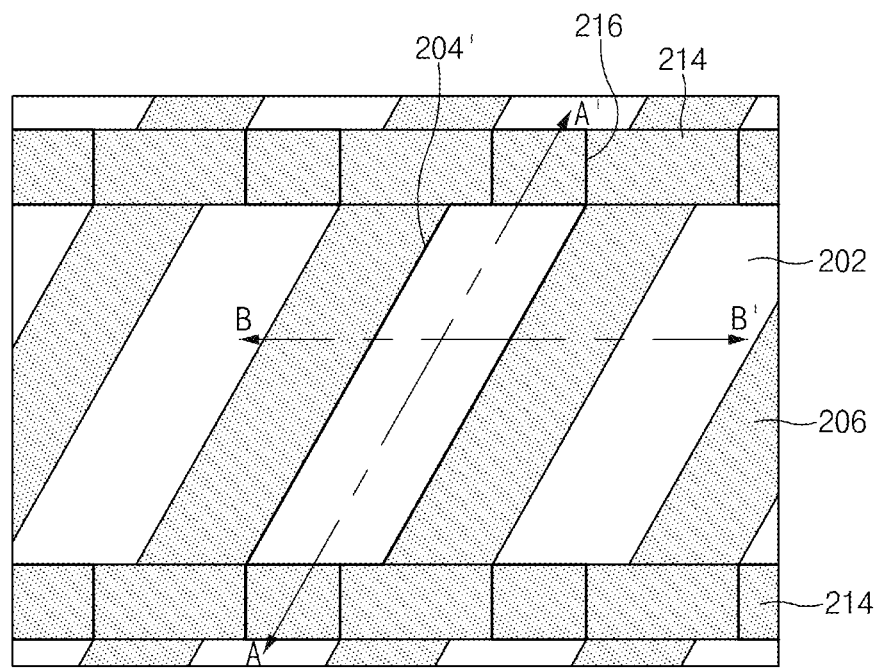
Figure 5B:
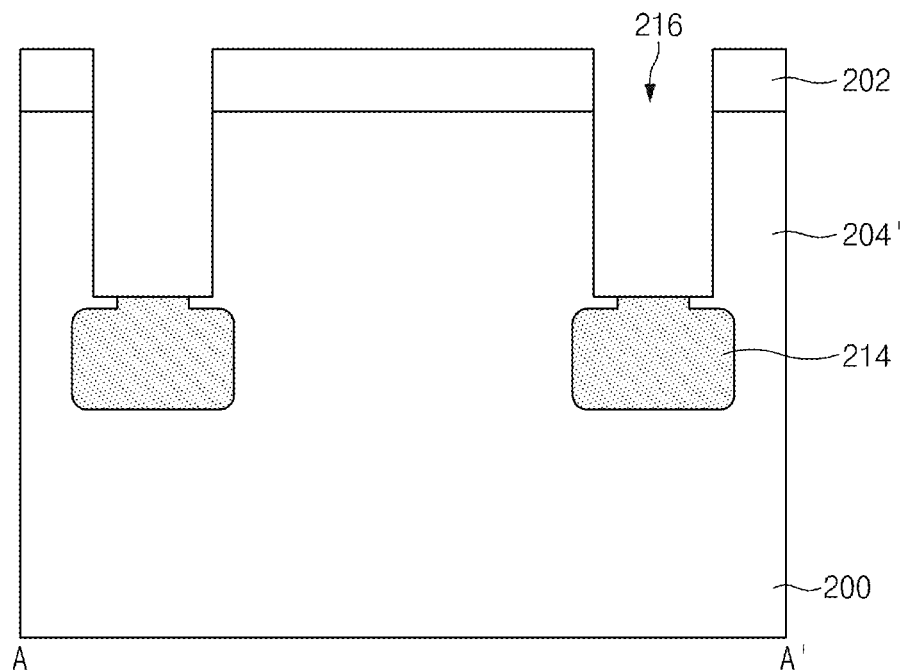
Figure 5C:
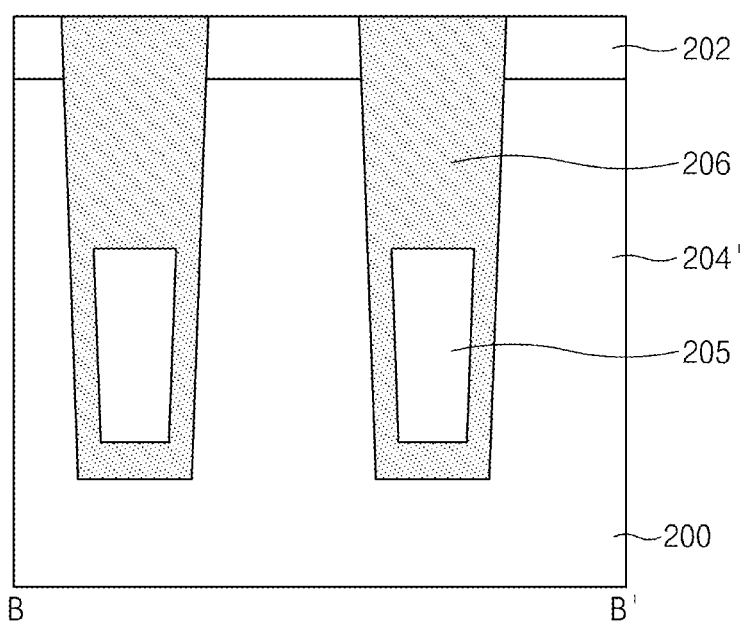

Referring to FIGS. 5A, 5B, and 5C, an insulation film is fills the trench 212 and 208, resulting in formation of a device isolation film 214. In an embodiment, the insulation film may include the same material as the device isolation film 206. The active region 204' may be defined by the device isolation films (206, 214). Subsequently, the device isolation film 214 filling the trench 212 is selectively etched back so that a plurality of hole-type trenches 216 are formed at intervals of a predetermined distance in the second direction. In this embodiment, each of the hole-type trenches 216 is formed in a region between two neighboring island-type active regions 204'. FIG. 5A shows the hole-type trench 216 having a rectangular shape in a plan view, but embodiments are not limited thereto.

In an embodiment, when the insulation film is etched back, the spacer 210 formed on the sidewalls of the island-type active regions 204' is also removed. The predetermined distance may be greater than a distance between two neighboring device isolation films 206. That is, a hole-type trench 216 having a predetermined depth is formed in each region from which the active region 204 is removed by the ISO cut mask as described with reference to FIG. 3A. In an embodiment, the hole-type trench 216 may be formed to have a predetermined size exposing sidewalls of the active regions 204' located at both sides of the hole-type trench 216, and may have a predetermined depth limited by a top surface of the bulb-type device isolation film 214. As a result, the island-type active region 204' may be defined by the device isolation films 206 and 214 in the second direction and the first direction, respectively.

Figure 6A:
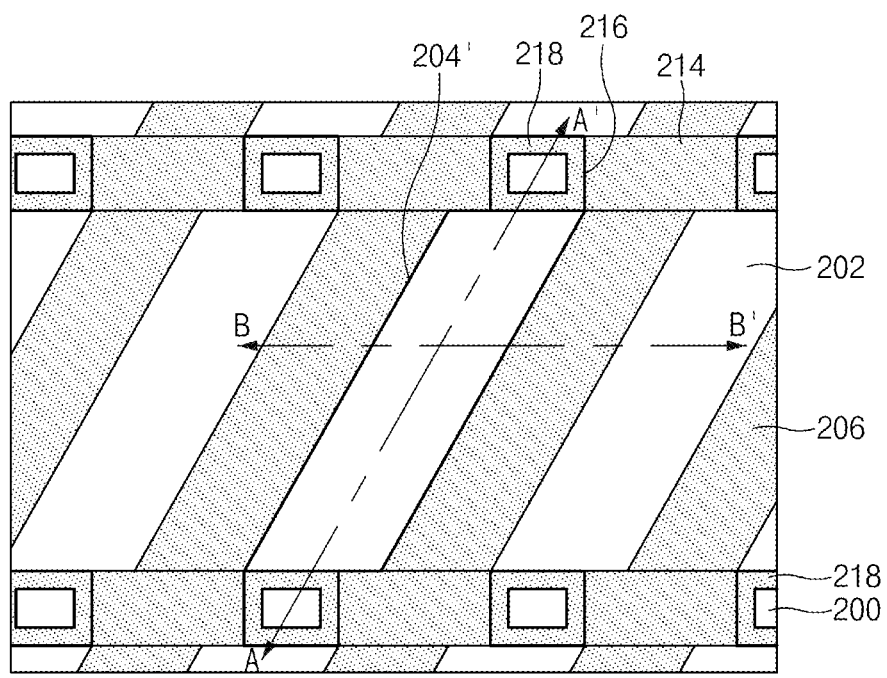
Figure 6B:
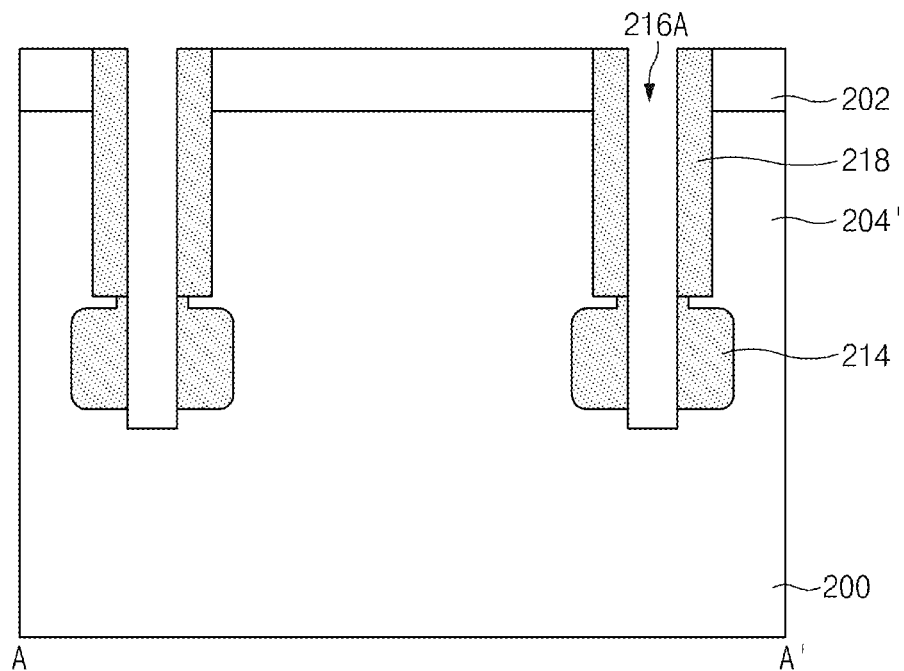
Figure 6C:
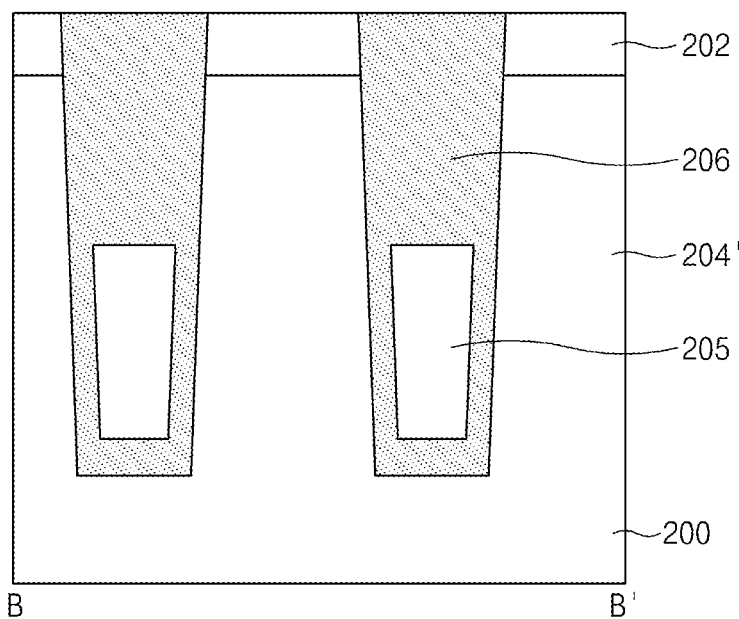

Referring to FIGS. 6A, 6B, and 6C, a spacer 218 is formed on a sidewall of the hole-type trench 216. In an embodiment, the spacer 218 may include an oxide film.

Subsequently, the bulb-type device isolation film 214 located below the hole-type trench 216 is etched until the substrate 200 is exposed using the spacer 218 as an etch mask. As a result, a trench 216A is formed. In an embodiment, the substrate 200 may be etched by a predetermined depth from a bottom surface of the bulb-type device isolation film 214.

Figure 7A:
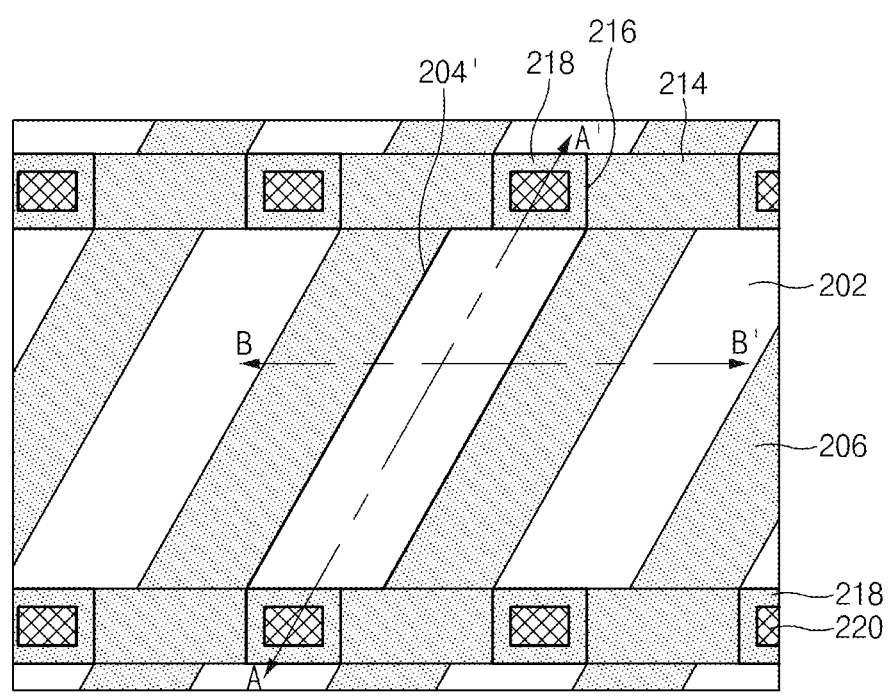
Figure 7B:
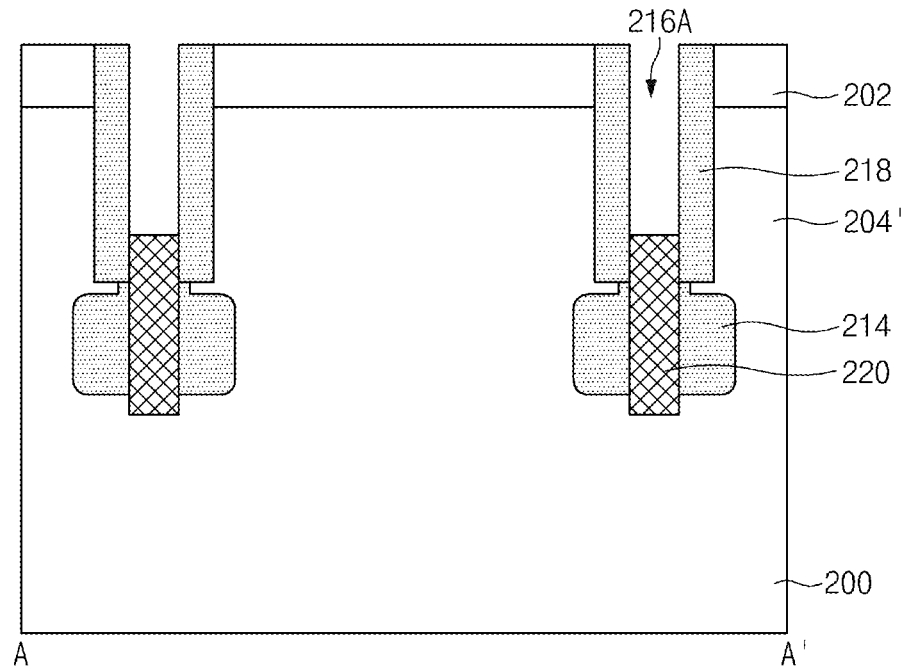
Figure 7C:
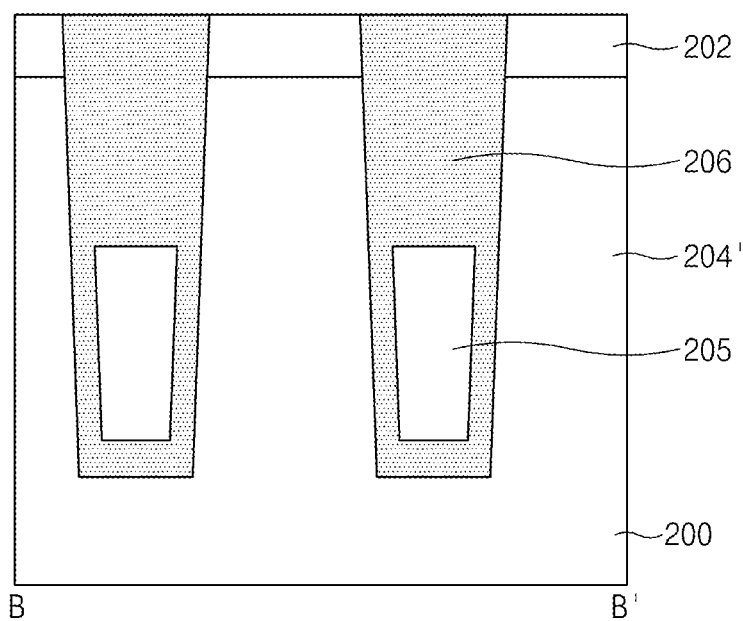

Referring to FIGS. 7A, 7B, and 7C, a conductive film is fills the trench 216A and is etched back, so that a lower body-tied structure 220 is formed to fill a lower portion of the trench 216A. That is, a pillar-shaped conductive structure coupled to the substrate 200 is formed in the bulb-type device isolation film 214. In an embodiment, the conductive film for forming the lower body-tied structure 220 may include a doped polysilicon material.

Figure 8A:
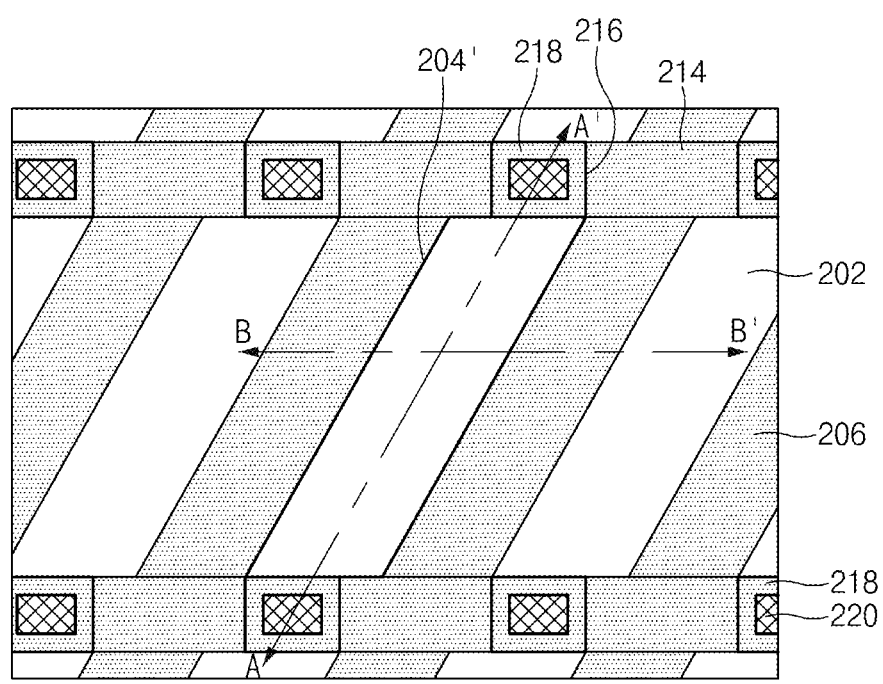
Figure 8B:
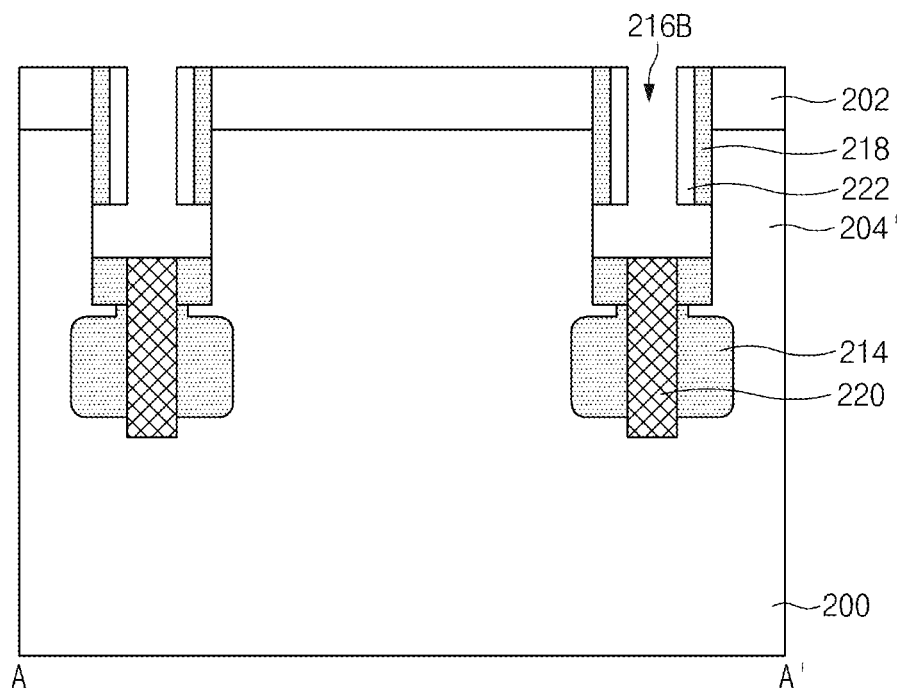
Figure 8C:
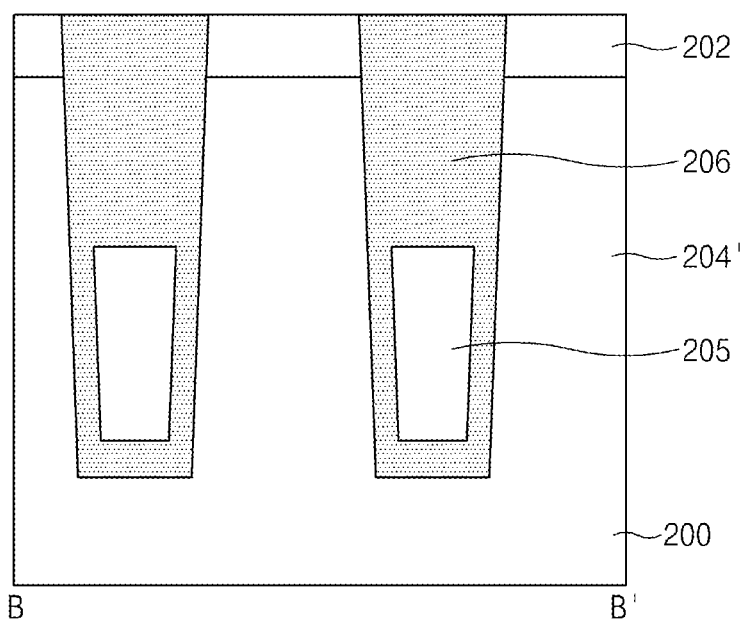

Referring to FIGS. 8A, 8B, and 8C, a spacer 222 is formed over the spacer 218. In an embodiment, the spacer 222 is formed to expose a lower portion of the spacer 218, and formed of a material having an etch rate different from that of the spacer 218. The spacer 222 may include a nitride film. In FIG. 8A, the spacer 222 is omitted for the simplicity of figures.

Subsequently, the exposed lower portion of the spacer 218 is removed by a cleaning process based on the etch selectivity of the spacers 218 and 222, so that sidewalls of the active regions 204' located at both sides of the lower body-tied structure 220 are partially exposed. As a result, a trench 216B is formed to have a lower portion wider than an upper portion thereof.

Figure 9A:
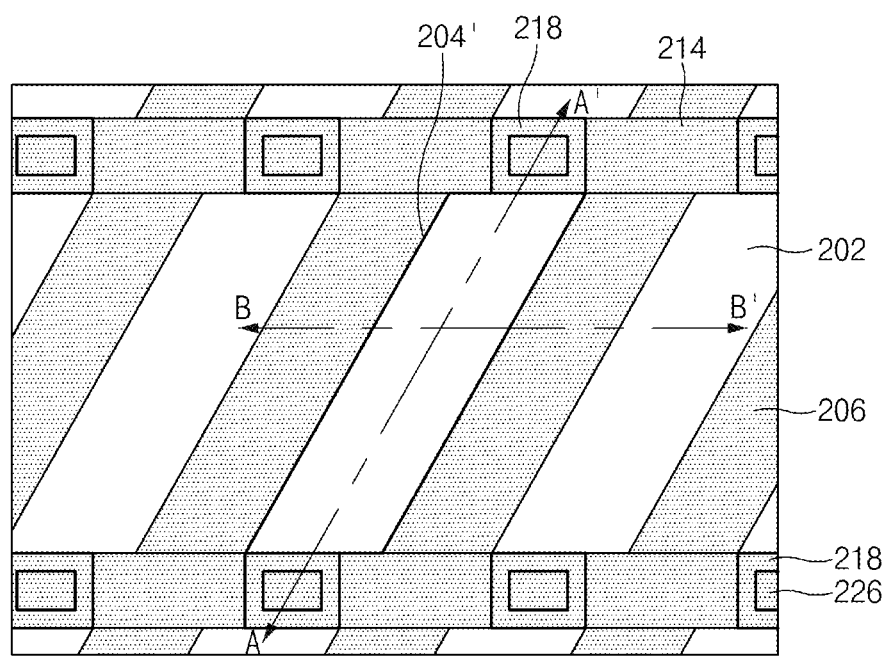
Figure 9B:
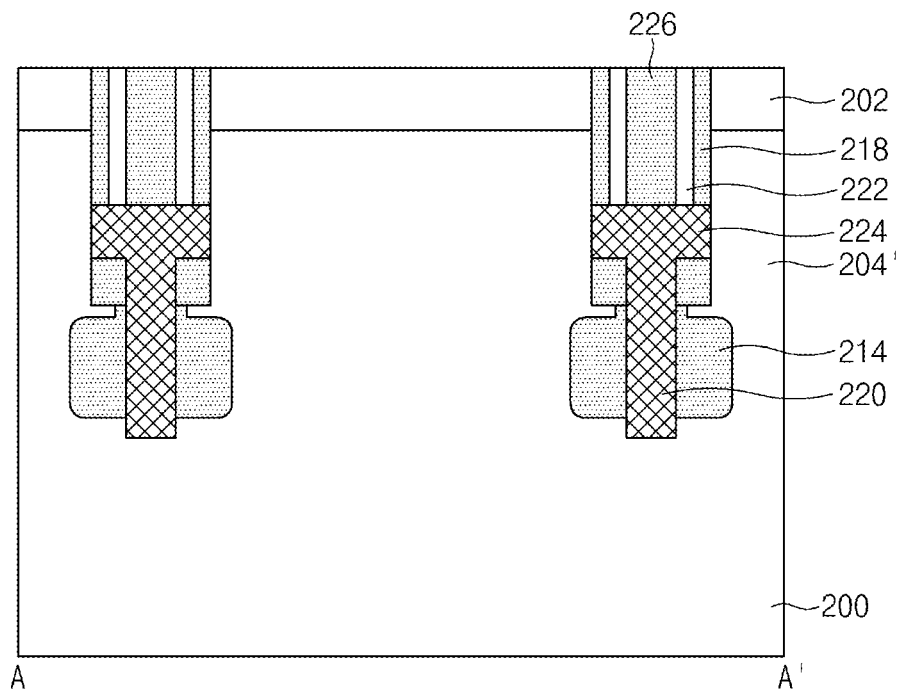
Figure 9C:
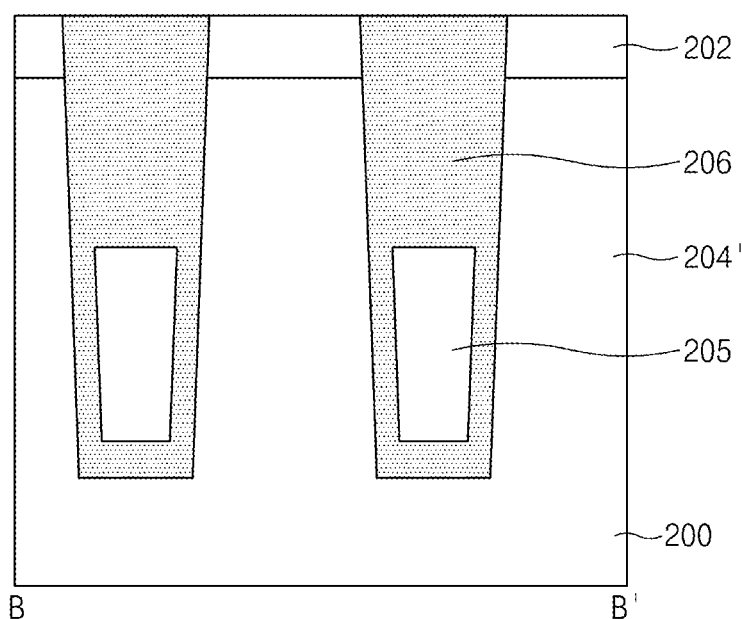

Referring to FIGS. 9A, 9B, and 9C, a conductive film is fills the trench 216B exposing the active region 204' and then etched back so that the conductive film remains only in the lower portion of the trench 216B. The remaining conductive film forms an upper body-tied structure 224 interconnecting the lower body-tied structure 220 and the active regions 204' exposed by the trench 216B. In an embodiment, the conductive film for forming the upper body-tied structure 224 may include doped polysilicon. That is, the BSC (Both Side Contact)-shaped upper body-tied structure 224 is formed over the lower body-tied structure 220 and commonly coupled to the active regions 204' located at both sides of the lower body-tied structure 220. As a result, a pillar-shaped body-tied structure for coupling two neighboring active regions 204' to the substrate 200 is formed. The pillar-shaped body-tied structure has a cross section of a 'T' shape.

Subsequently, an insulation film 226 is formed over the upper body-tied structure 224 so as to fill the upper portion of the trench 216B, and then the insulation film 226 is planarized. In an embodiment, the insulation film may include an oxide film.

Figure 10A:
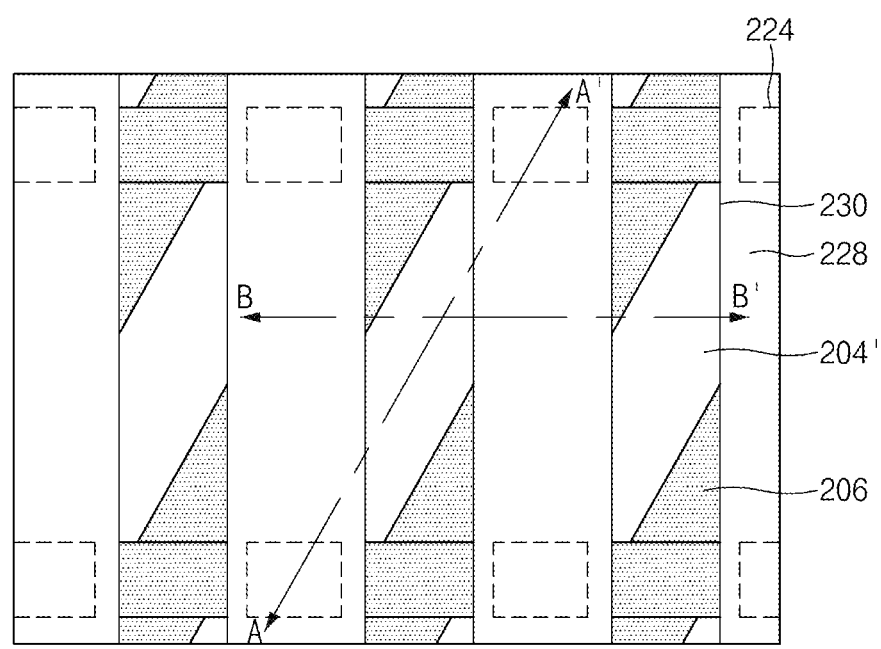
Figure 10B:
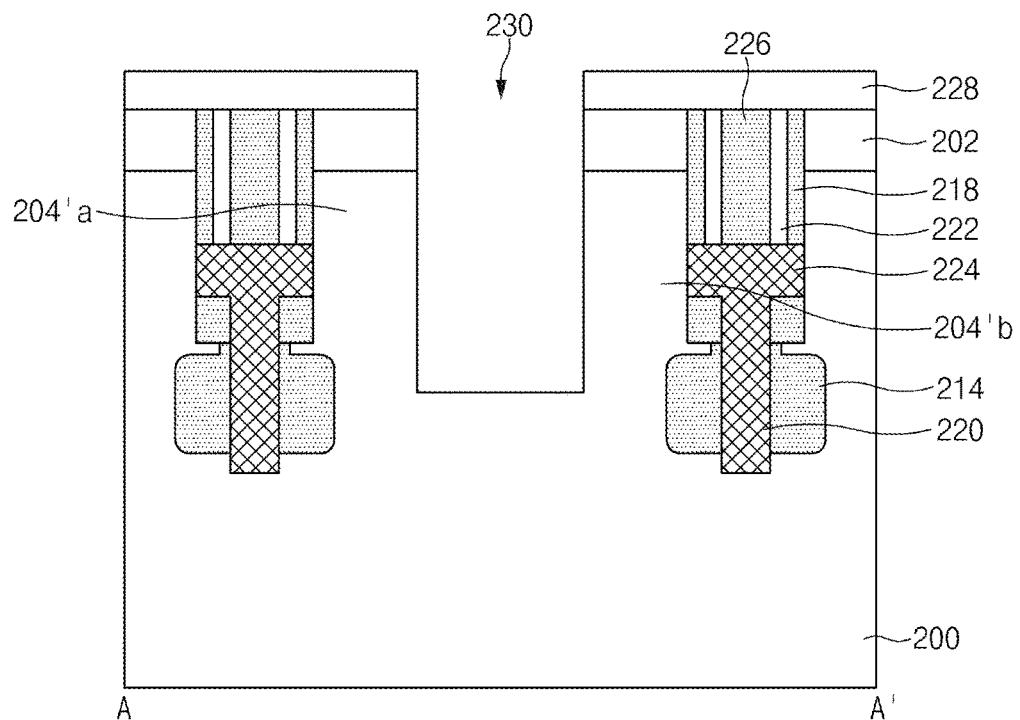
Figure 10C:
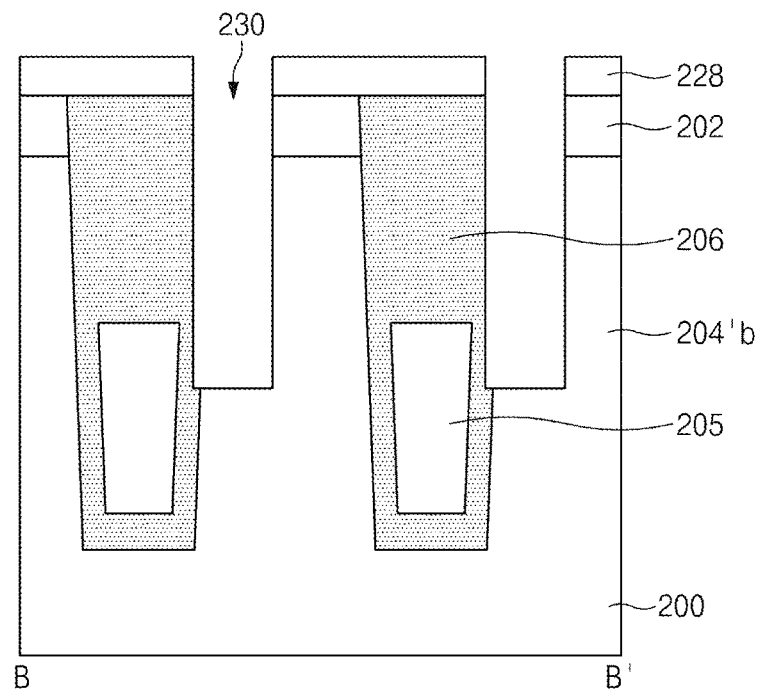

Referring to FIGS. 10A, 10B, and 10C, a bit line mask 228 defining a bit line region is formed over a resultant structure of FIGS. 9A, 9B, and 9C, and then the hard mask pattern 202, the active region 204' and the device isolation film 206 are etched using the bit line mask) 228 to form a bit-line trench 230 to be used for a bit line. The bit-line trench 230 is formed between two neighboring body-tied structures 224 arranged along the first direction. As a result, the active region 204' is divided into two active pillars 204'$a$ and 204'$b$ by the bit-line trench 230. In an embodiment, the bit line mask 228 has a width sufficiently covering a region corresponding to the body-tied structure and extends in a third direction orthogonally crossing the second direction corresponding to the line B-B'.

Figure 11A:
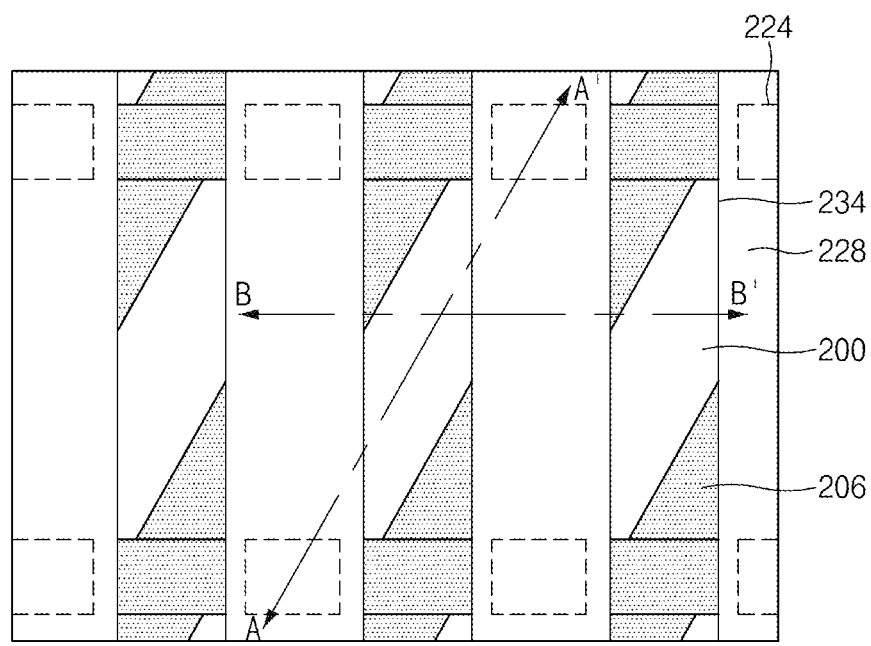
Figure 11B:
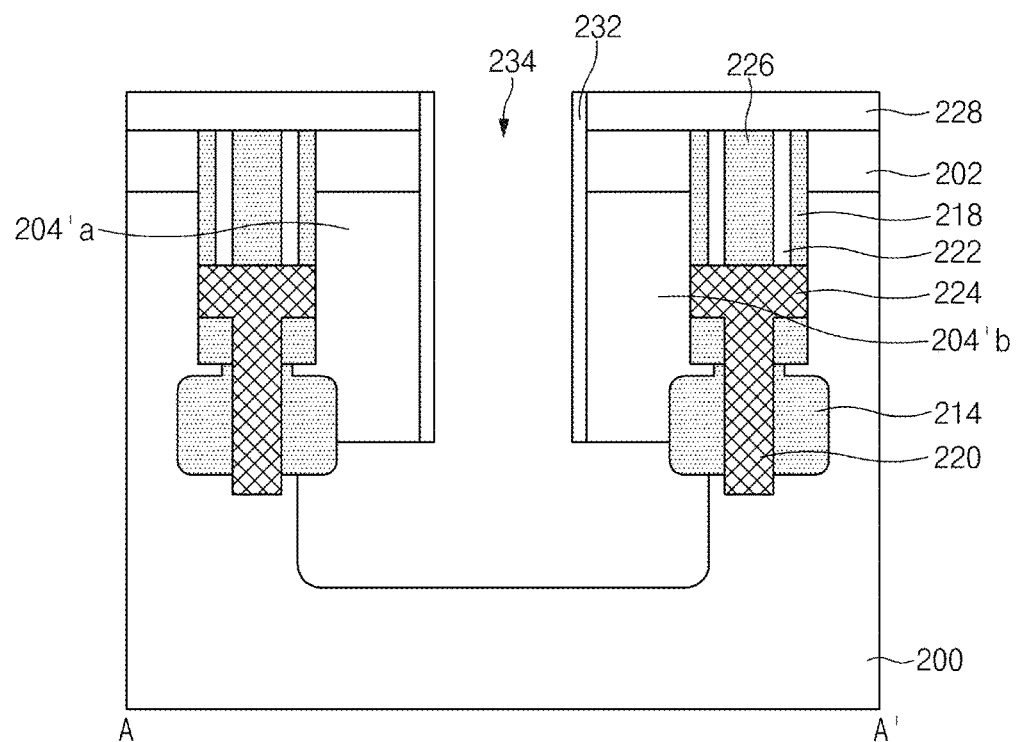
Figure 11C:
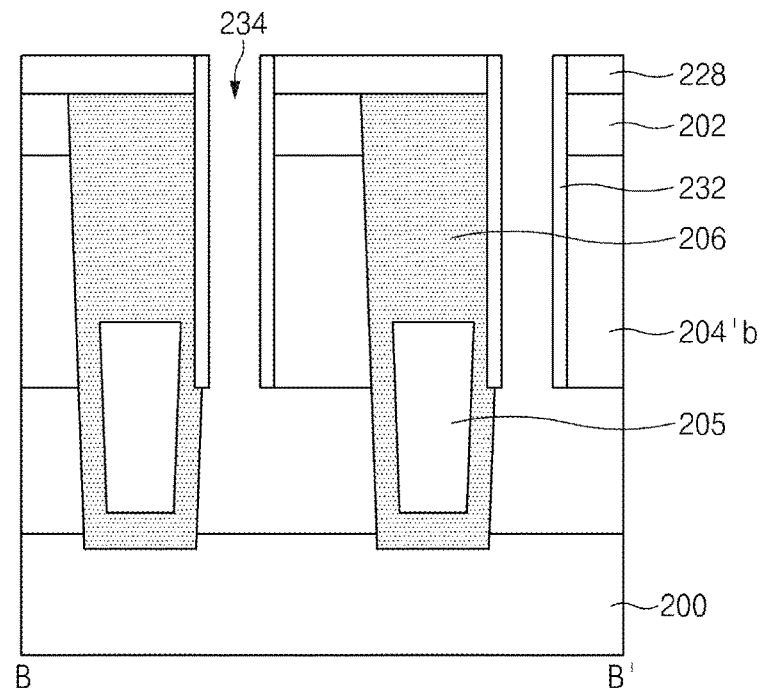

Referring to FIGS. 11A, 11B, and 11C, a spacer 232 is formed on a sidewall of the bit-line trench 230. In an embodiment, after a spacer insulation film is formed on the sidewall and bottom of the bit-line trench 230, the spacer insulation film is etched back so that the spacer 232 may be formed only on the sidewall of the bit-line trench 230. In an embodiment, the spacer 232 may include a nitride film. In FIG. 11A, the spacer 232 is omitted for the simplicity of figures.

Subsequently, the active region 204' exposed at the bottom of the bit-line trench 230 is etched in a bulb shape using the spacer 232 as a barrier film to thereby form a trench 234 isolating the active pillars 204'a and 204'b from the substrate 200.

Figure 12A:
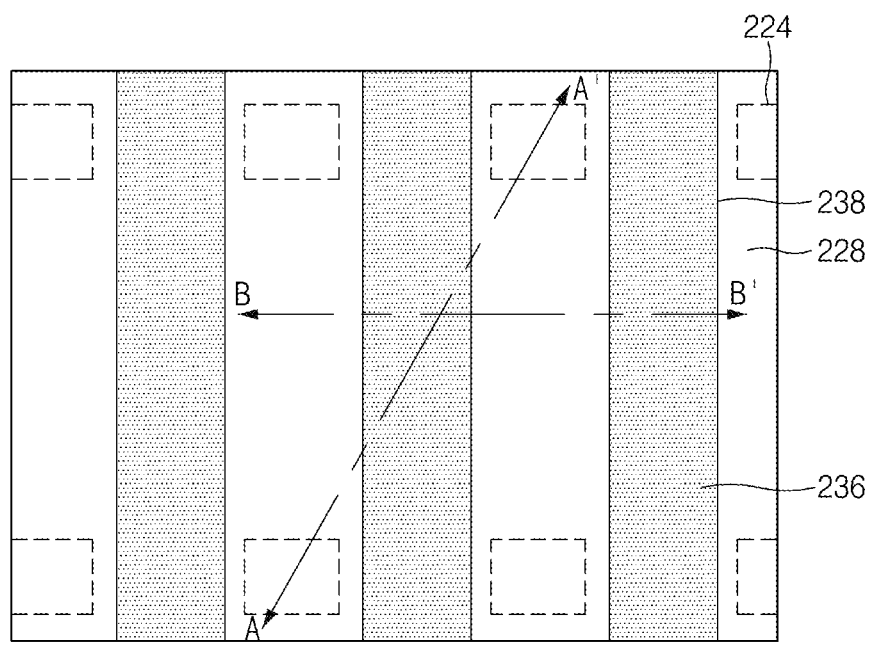
Figure 12B:
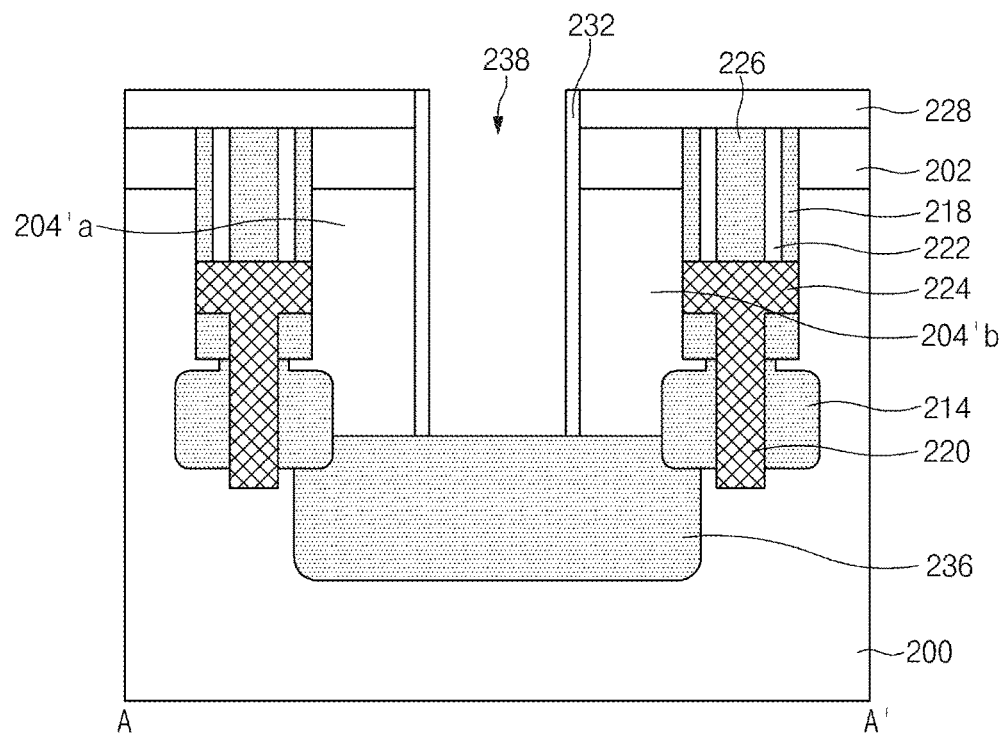
Figure 12C:
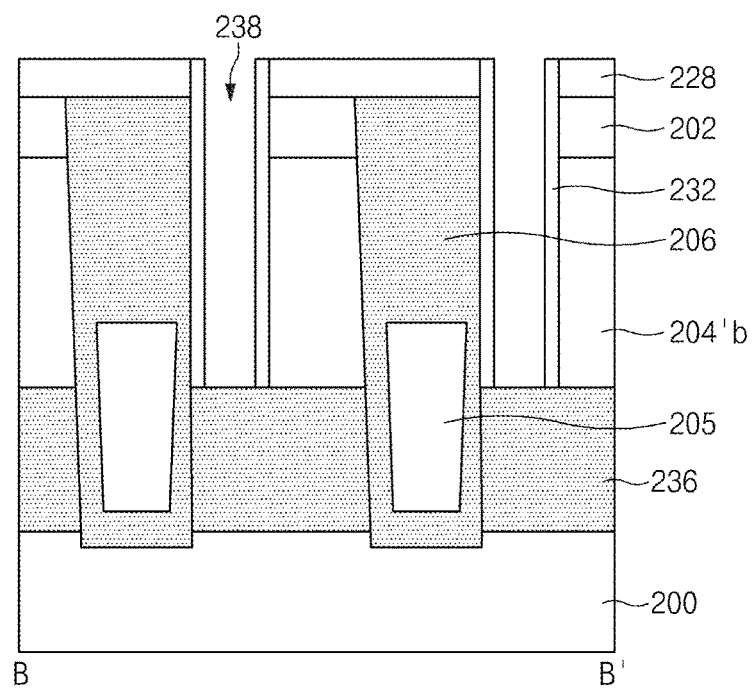

Referring to FIGS. 12A, 12B, and 12C, an insulation film is formed to fill the trench 234.

Subsequently, the insulation film is annealed, and then planarized. Thereafter, the insulation film is etched back to a predetermined depth so that the insulation film remains only in a lower portion, i.e., the bulb-shaped portion, of the trench 234. As a result, a portion of the trench 234 from which the insulation film is removed forms a trench 238, and an insulation film 236 is formed between the substrate 200 and the active pillars 204'a and 204'b.

Figure 13A:
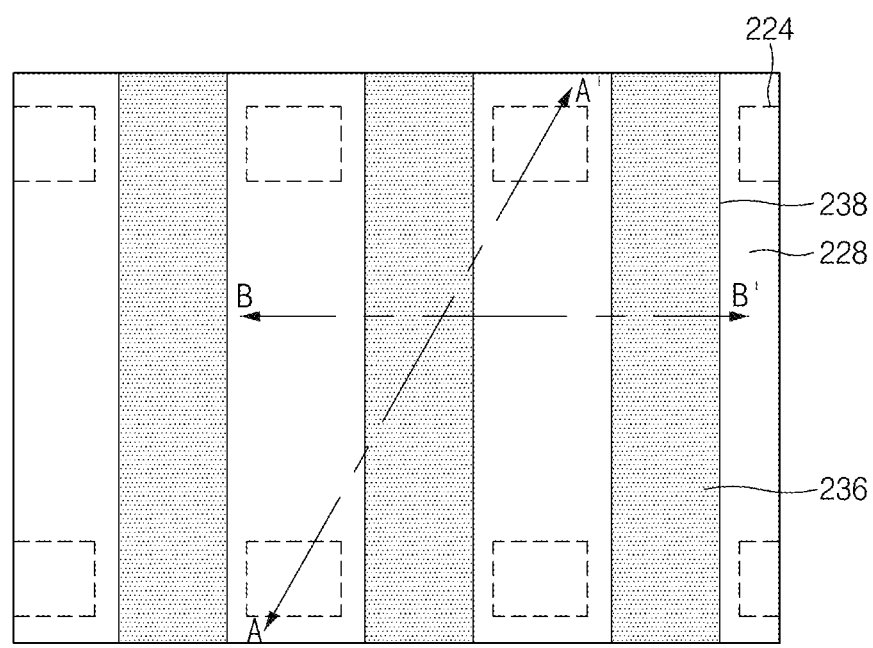
Figure 13B:
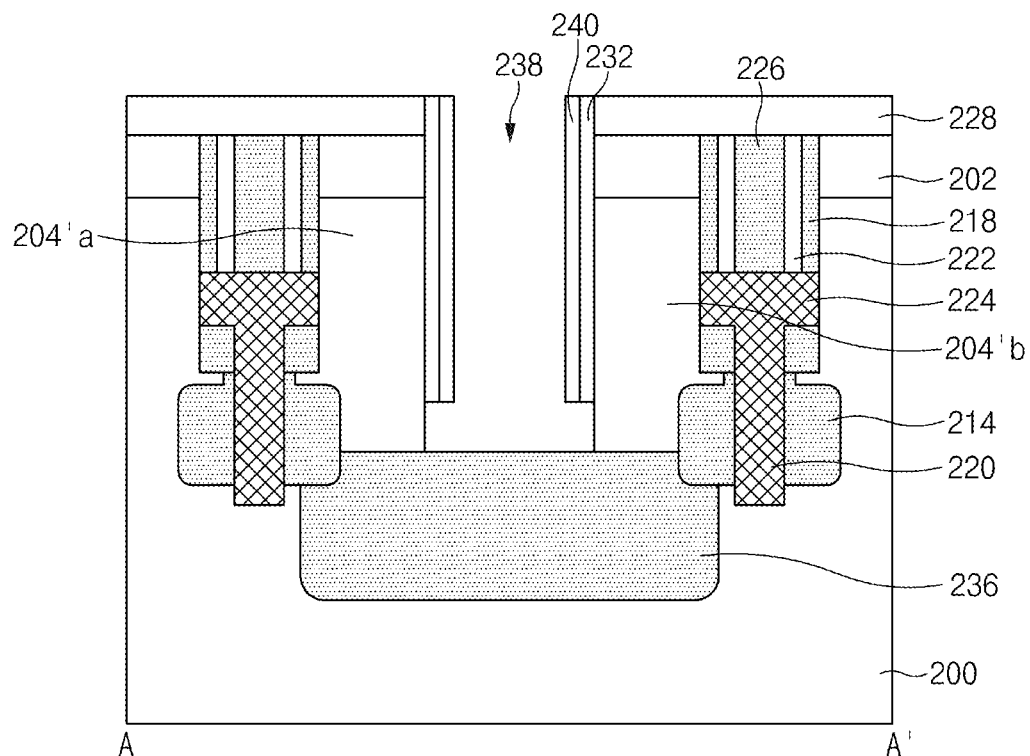
Figure 13C:
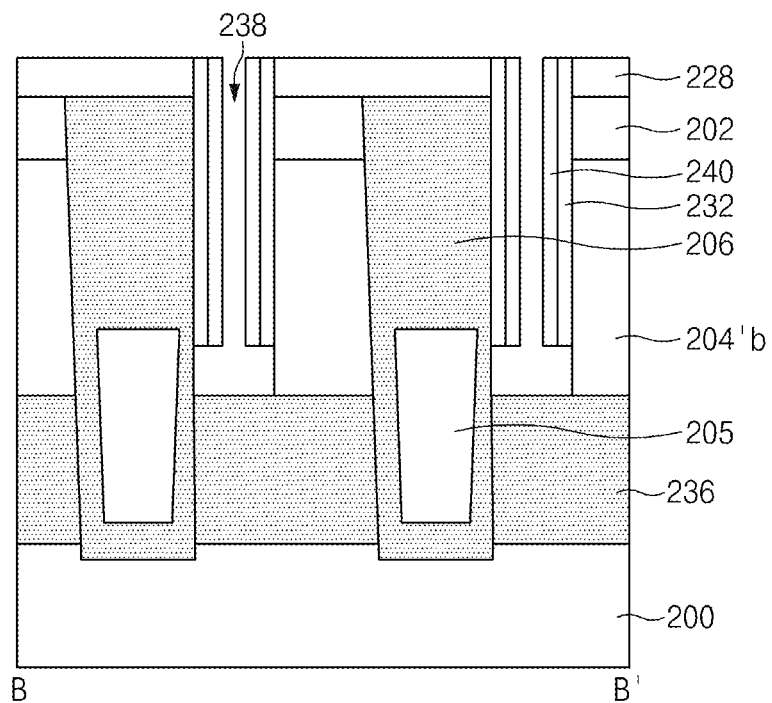

Referring to FIGS. 13A, 13B, and 13C, a spacer 240 is formed over the spacer 232. In an embodiment, the spacer 240 is formed to expose the spacer 232 at a lower sidewall of the trench 238, and includes a material having an etch rate different from that of the spacer 232. The spacer 240 may include a barrier metal (e.g., TiN) material.

Thereafter, the exposed portion of the spacer 232 is removed by a cleaning process based on the etch selectivity of the spacers 232 and 240, so that lower sidewalls of the active pillars 204'a and 204'b located at both sides of the trench 238 are exposed. In FIG. 3A, the spacers 232 and 240 are omitted for the simplicity of figures.

Figure 14A:
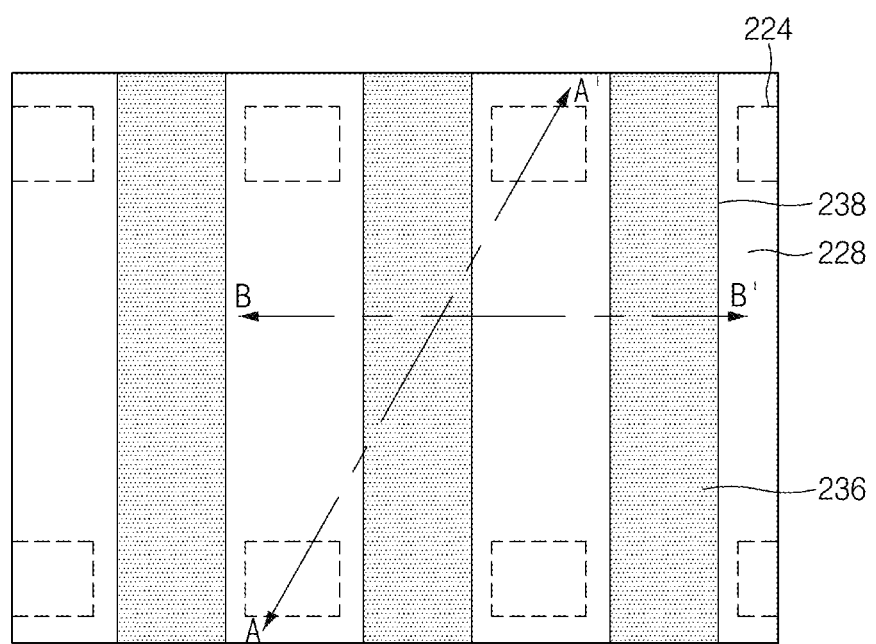
Figure 14B:
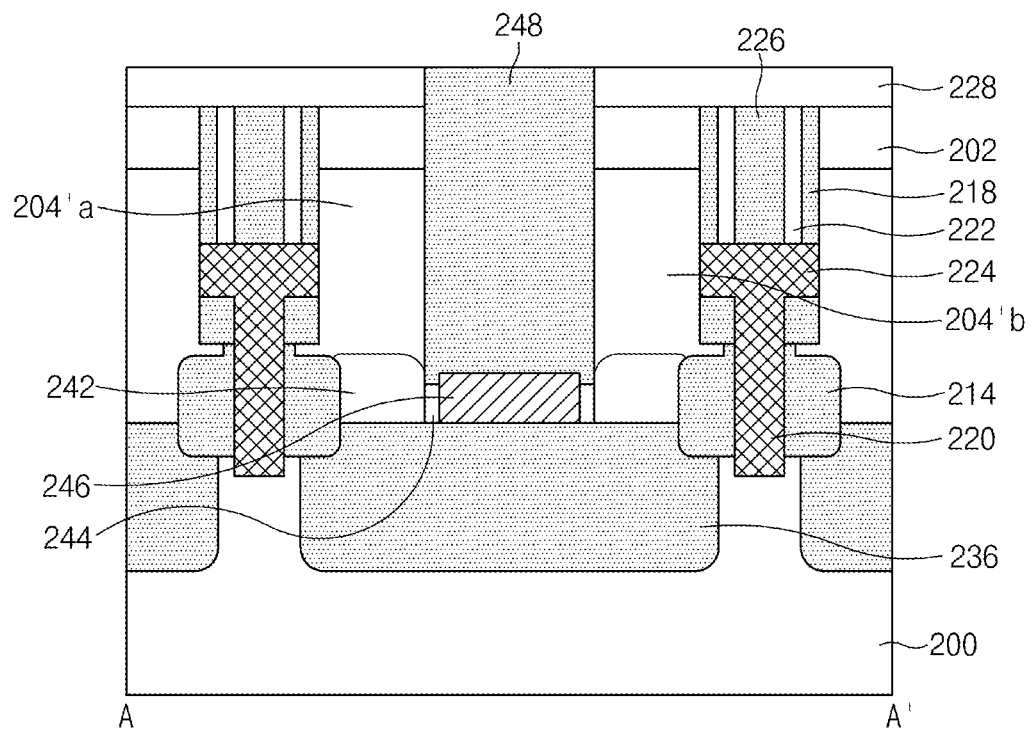
Figure 14C:
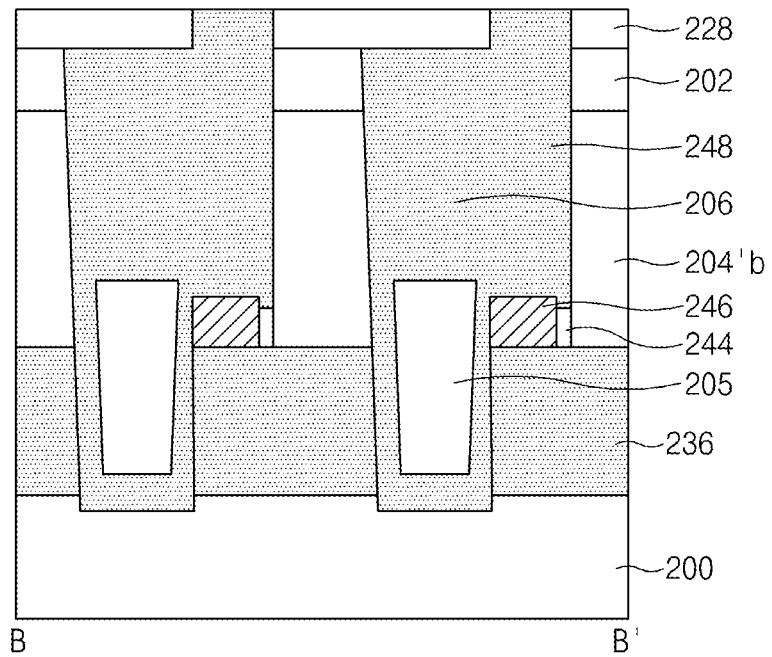

Referring to FIGS. 14A, 14B, and 14C, impurities are implanted into the active pillars 204'a and 204'b through the exposed portions thereof by ion implantation or plasma doping (PLAD). As a result, a bit-line junction region 242 is formed in a lower portion of each of the active pillars 204'a and 204'b. Phosphorus (Ph) or arsenic (As) may be used as a source during the plasma doping.

Subsequently, the spacer 240 is removed by the cleaning process, and a bit-line contact 244 is formed on a sidewall of each of the exposed active pillars 204'a and 204'b. In an embodiment, the bit-line contact 244 may include a silicide film. In an embodiment, after a cobalt (Co) film is formed on a sidewall of the trench 238 and then annealed, the cobalt (Co) film contacting the active pillars 204'a and 204'b may be selectively converted into a cobalt silicide (CoSix) film by reacting with silicon contained in the active pillars 204'a and 204'b, and the remaining cobalt without being combined with silicon may be removed by a subsequent cleaning process. In other embodiments, this silicide film may include a titanium silicide (TiSix) film, a tungsten silicide (WSix) film, or a nickel silicide (NiSix) film.

Subsequently, a metal layer (not shown) fills the trench 238, and then the metal layer is etched back so that a buried bit line 246 connected to the bit-line contact 244 is formed at a lower portion of the trench 238. In an embodiment, the metal layer may include tungsten (W).

Thereafter, the spacer 232 is removed, a capping insulation film 248 is formed over the buried bit line 246 in such a manner that the capping insulation film 248 fills the remaining portion of the trench 238 to insulate the buried bit line 246. In an embodiment, the capping insulation film 248 may include an oxide film.

Figure 15B:
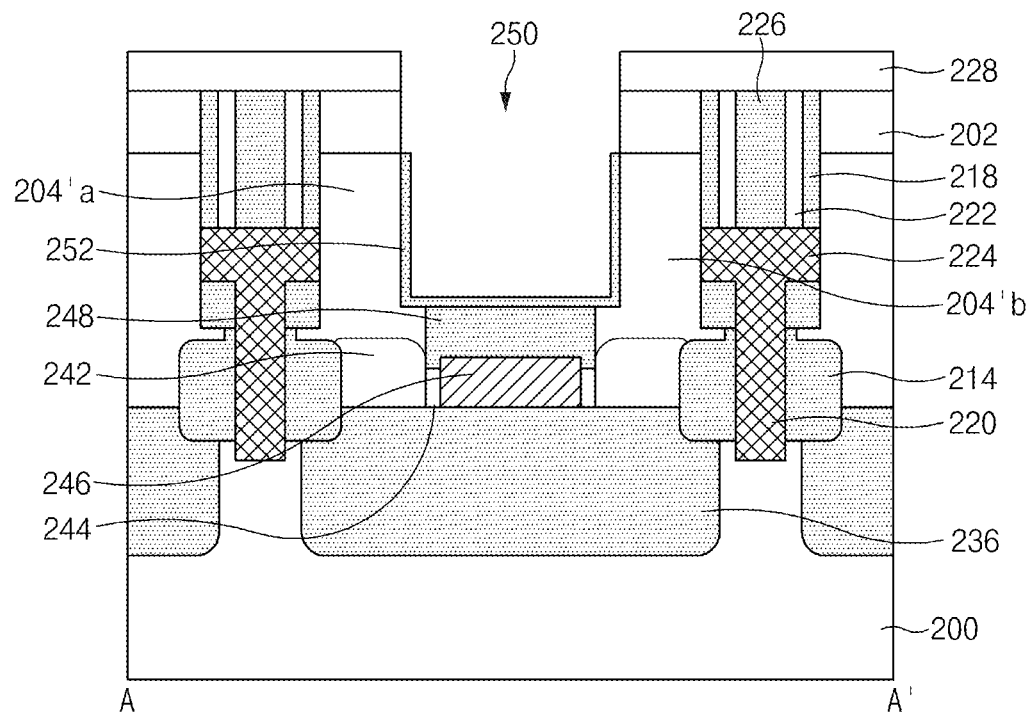
Figure 15C:
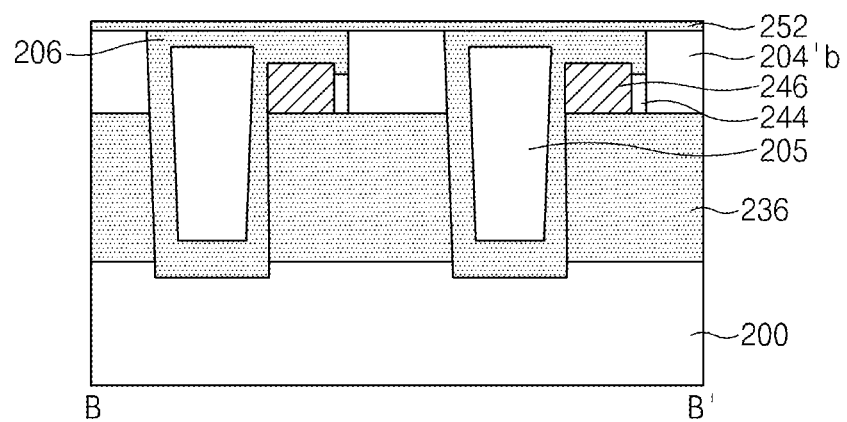

Referring to FIGS. 15A, 15B, and 15C, the hard mask patterns 202 and 228, the device isolation film 206, the active pillars 204'a and 204'b, and the capping insulation film 248 are etched using a gate mask (not shown) defining a buried-gate formation region, resulting in formation a trench 250 for a gate. The trench 250 extends along the second direction corresponding to the line B-B' that crosses the buried bit line 246.

Subsequently, a wet widening process is performed based on the etch selectivity of the silicon layers 204'a and 204'b, the nitride films 202 and 228, and the oxide films 206 and 248 to selectively etch the device isolation film 206 and the capping insulation film 248. As a result, the width of the gate trench 250 is increased to expose three sidewalls of each of the active pillars 204'a and 204'b. In FIG. 15A, the widened gate trench 250 is shown in the form of a dotted line (i.e., alternated long and short dash line). Subsequently, a gate insulation film 252 is formed on an inner surface of the gate trench 250. In an embodiment, the gate insulation film 252 may include an oxide film.

Figure 16A:
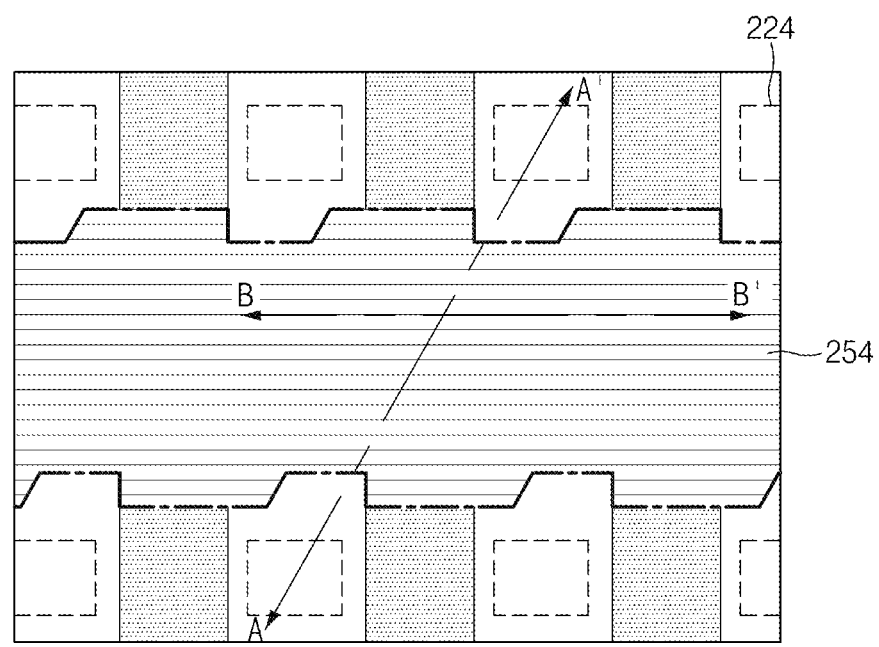
Figure 16B:
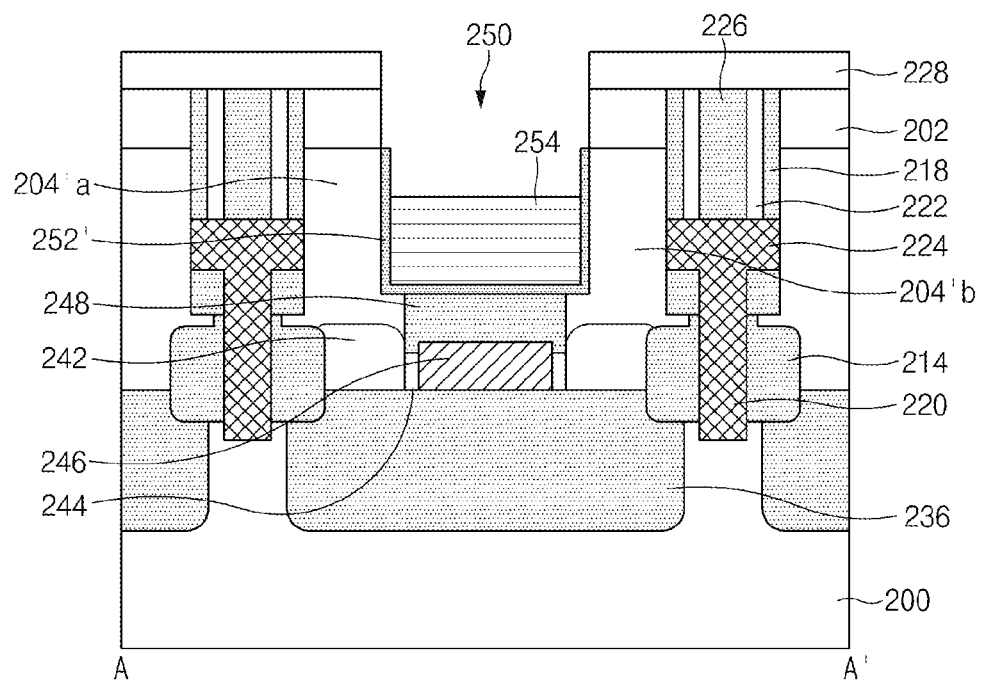
Figure 16C:
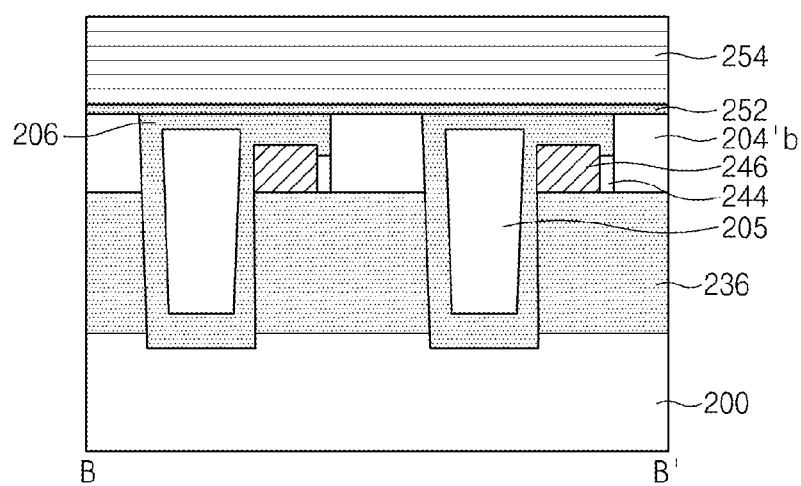

Referring to FIGS. 16A, 16B, and 16C, a gate conductive film 254 is formed to fill the gate trench 250 and then etched back so that the gate conductive film 254 remains in a lower portion of the gate trench 250. In an embodiment, the gate conductive film 254 may include metal such as titanium (Ti), titanium nitride (TiN), tungsten (W), or a combination thereof.

Figure 17A:
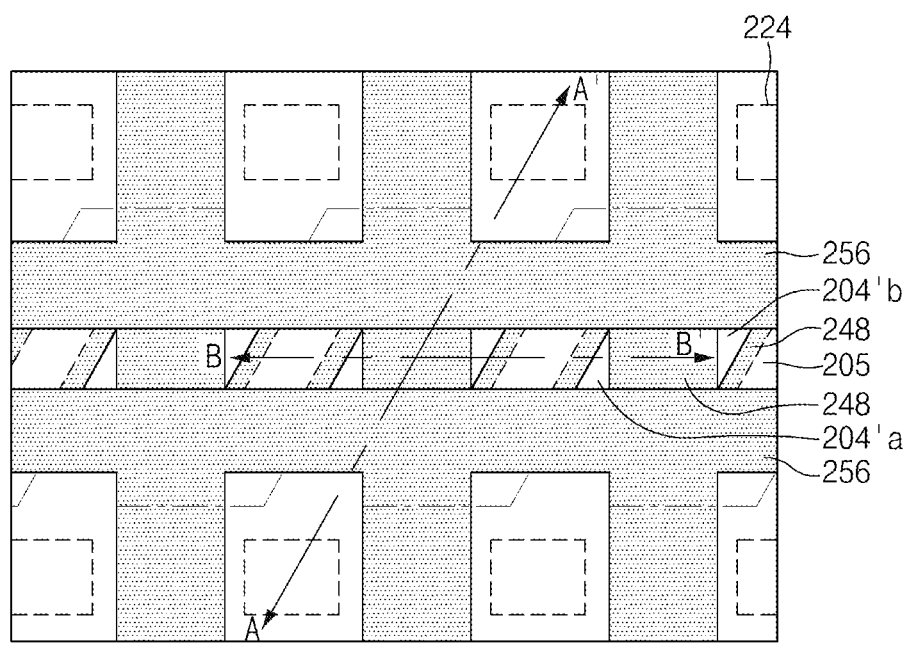
Figure 17B:
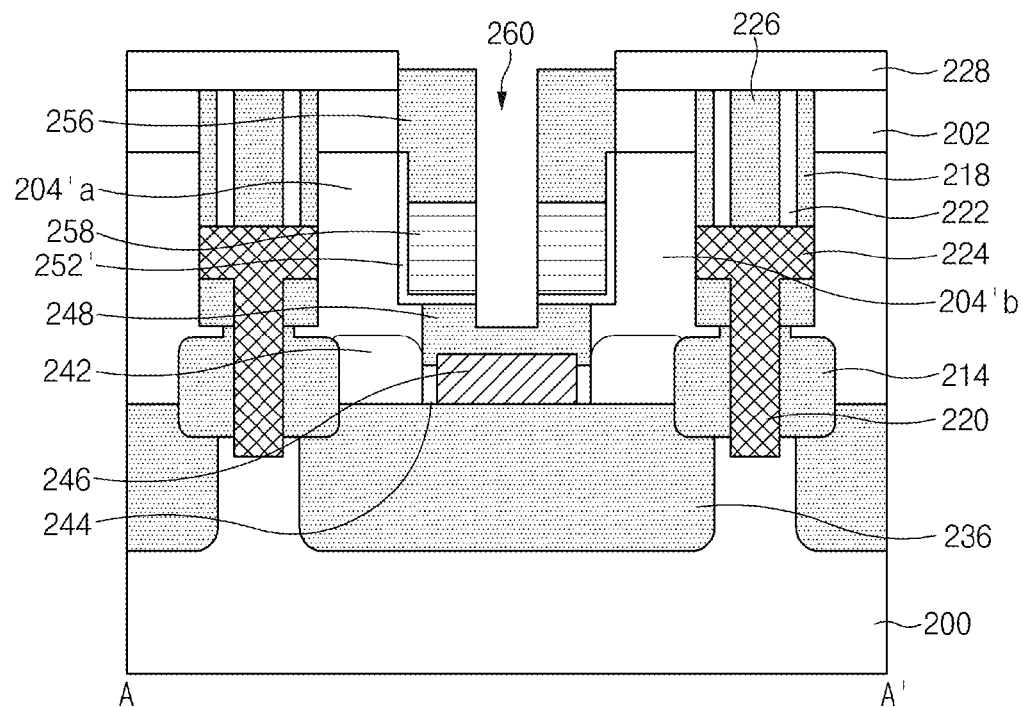
Figure 17C:
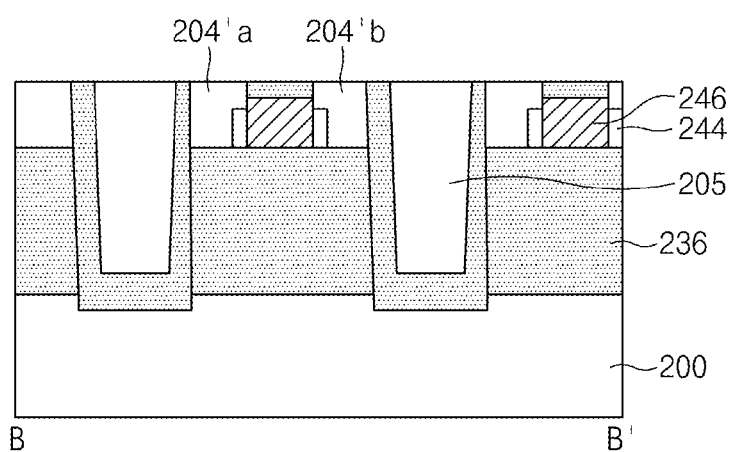

Referring to FIGS. 17A, 17B and 17C, an insulation film is formed over the gate conductive film 254 so as to fill the gate trench 250. In an embodiment, the insulation film may include an oxide film.

Subsequently, a central parts of the insulation film 256 filling the gate trench 250 and the gate conductive film 254 are etched in the second direction until the sacrificial film 205 is exposed using a line-type cut mask, resulting in formation of a trench 260 by which the gate conductive film 254 is divided into two parts, e.g., two buried gates 258. In FIG. 17A, the location of line B-B' is different from the location in FIGS. 16A and 18A so that the bit line structure in FIG. 17C is different from the structure in FIG. 16C.

Figure 18A:
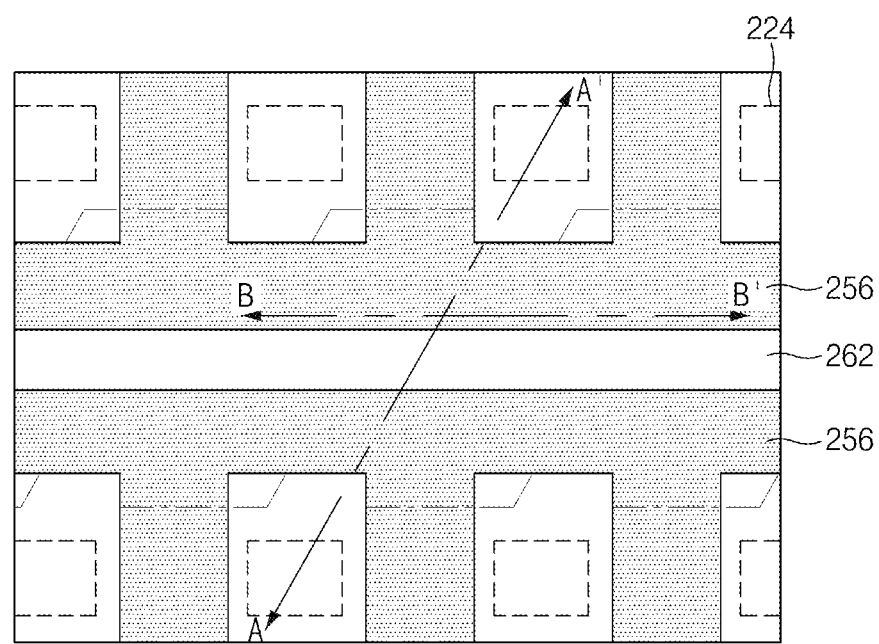
Figure 18B:
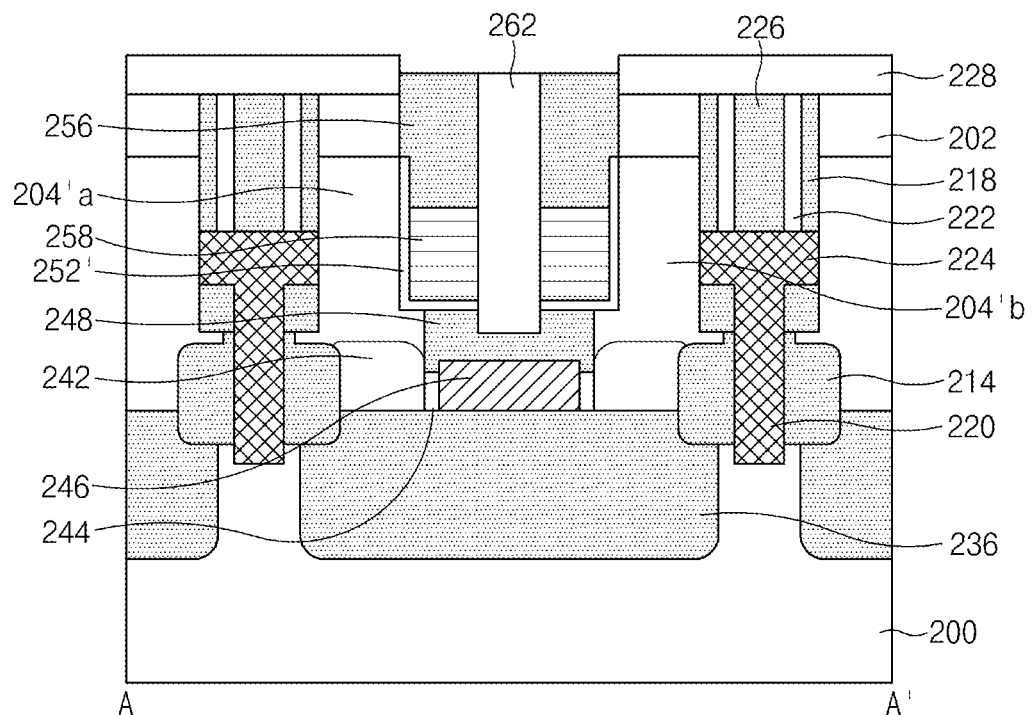
Figure 18C:
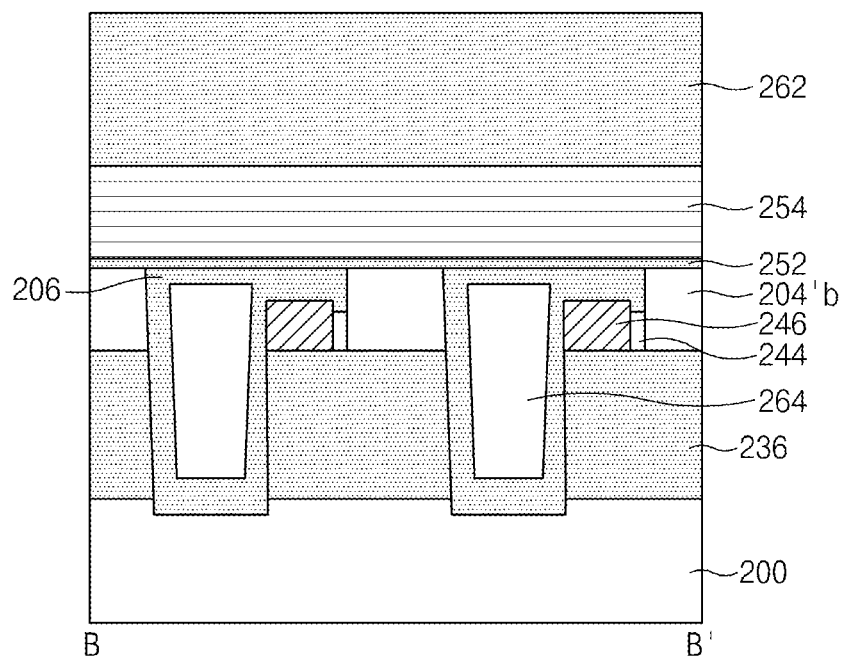

Referring to FIGS. 18A, 18B, and 18C, the sacrificial film 205 exposed by the trench 260 is removed. Here, the sacrificial film 205 may be removed by a strip process.

Subsequently, an insulation film 262 is formed to fill the trench 260. During the process of filling the trench 260 with the insulation film 262, since a space from which the sacrificial film 205 is removed has a small opening, the space is not fully filled with the insulation film 262 and thus a substantive part of the space remains empty, resulting in formation of an air gap 264.

Figure 19:
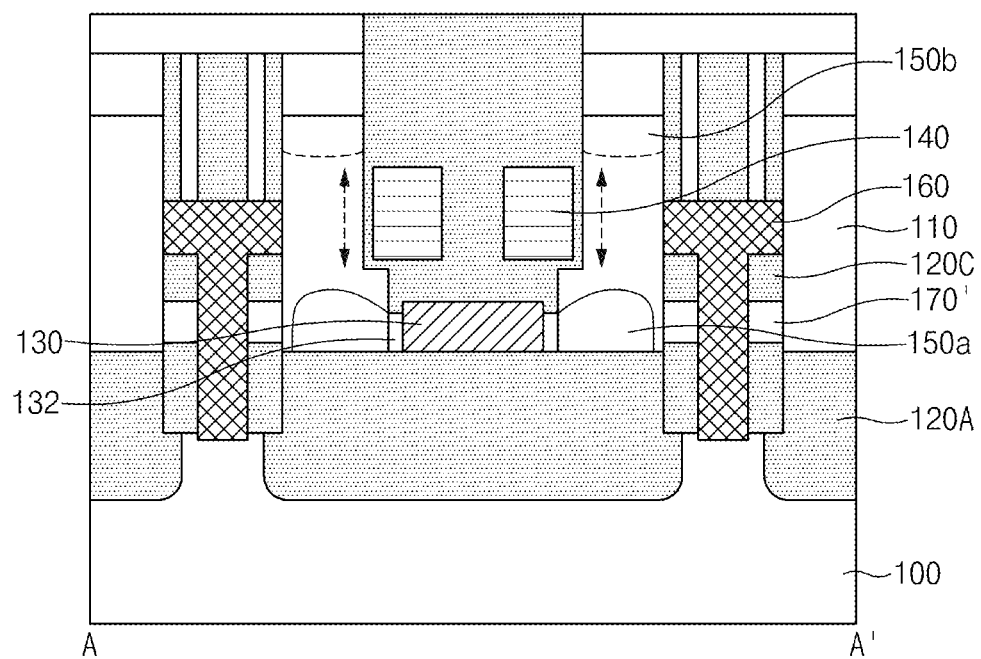
FIG. 19 is a cross-sectional view illustrating a semiconductor device according to another embodiment.

FIG. 19 is a cross-sectional view illustrating a semiconductor device according to another embodiment.

In accordance with this embodiment, an air gap 170' is formed around the body-tied structure 160. While the above-mentioned embodiment shown in FIGS. 1A to 1C shows that the bulb-type device isolation film 120B is formed between the body-tied structure 160 and the bit-line junction region 150a, this embodiment in FIG. 19 shows that the air gap 170' is formed between the body-tied structure 160 and the bit-line junction region 150a. As the air gap 170' is formed between the body-tied structure 160 and the bit-line junction region 150a, parasitic capacitance between the body-tied structure 160 and the bit-line junction region 150a can be more greatly reduced because the air gap 170' has a higher insulating characteristic than a device isolation film.

The active pillars 110 formed by etching the semiconductor substrate 100 may include vertical channel regions denoted by arrows in FIG. 19. The semiconductor substrate 100 may include a silicon-based material. In an embodiment, the semiconductor substrate 100 may include a monocrystalline silicon substrate. Since the active pillars 110 is formed by etching the semiconductor substrate 100, the active pillars 110 may also include a silicon-based material such as a monocrystalline silicon material.

The active pillars 110 may be defined by a plurality of device isolation films. The active pillars 110 may correspond to regions formed at both ends of an active region isolated by etching central parts of the active regions, and may be arranged in parallel in a line shape. Some of the device isolation films, e.g., first device isolation films 120A may be disposed below the active pillars 110 according to this embodiment. Therefore, the active pillars 110 may be separate from the substrate 100 by the first device isolation films 120A in the same manner as in a Silicon On Insulator (SOI) structure. Each device isolation film may include an oxide film.

Referring to FIG. 19, the body-tied structure 160 for coupling corresponding active pillars 110 to the substrate 100 is formed between two neighboring active pillars 110. The body-tied structure 160 is formed to remove a floating body effect in such a manner that holes generated in a channel region during a cell transistor operation are leaked out to the substrate 100. In an embodiment, the body-tied structure 160 may be formed in a pillar shape between two neighboring active pillars so that the body-tied structure 160 can be commonly coupled to the two neighboring active pillars 110. A lower portion of the body-tied structure 160 is coupled to the semiconductor substrate 100, and an upper portion of the body-tied structure 160 is commonly coupled to body sidewalls of the two neighboring active pillars 110 disposed at right and left sides of the upper portion of the body-tied structure 160, respectively. The air gap 170' encloses a middle portion of the body-tied structure 160. This body-tied structure 160 may include doped polysilicon.

Three sides of each of the active pillars 110 are enclosed by a gate 140, and junction regions 150a and 150b are respectively formed in an upper portion and a lower portion of a vertical channel region disposed in each of the active pillars 110. That is, one sidewall of the active pillar 110 is coupled to the body-tied structure 160, and the remaining three sidewalls other than the one sidewall are enclosed by the gate 140. As a result, the floating body effect is prevented from occurring, and an operation current can be sufficiently acquired.

A buried bit line (BBL) 130 is located below the gate 140 and formed between the active pillars 110 in such a manner that the buried bit line 130 extends in a direction crossing an extending direction of the gate 140. Therefore, as described above, a distance between the buried bit line 130 coupled to the junction region 150a and a storage node (not shown) coupled to the junction region 150b is sufficiently elongated, and thus parasitic capacitance between the buried bit line 130 and the storage node can be reduced.

A bit line contact 132 is formed at both sides of the buried bit line 130, and the bit line contact 132 is coupled to the bit line junction region 150a formed in the lower portion of the active pillar 110. That is, the buried bit line 130 may have a Both Side Contact (BSC) structure commonly coupled to the junction regions 150a of the active pillars 110 located at both sides thereof. In an embodiment, the buried bit line 130 may include a metal such as tungsten. The bit line contact 132 may include a silicide film.

Specifically, the air gap 170' is formed in a second device isolation film 120C disposed between the buried bit lines 130, so that parasitic capacitance between the bit lines 130 can be more reduced than in the case in which the device isolation film 120C is composed of an oxide film (or a nitride film) only, as shown in FIG. 1B.

FIGS. 20 to 25 are cross-sectional views illustrating a methods for forming the semiconductor device shown in FIG. 19 according to an embodiment. For convenience of description and better understanding, when reference numerals are given to constituent elements of each drawing, like reference numerals are given to like constituent elements although illustrated in the different drawings. The following description will be given focusing on constituent elements that are different from those of the above-mentioned embodiments described with reference to FIGS. 1A to 18C, but embodiments are not limited thereto.

Figure 20:
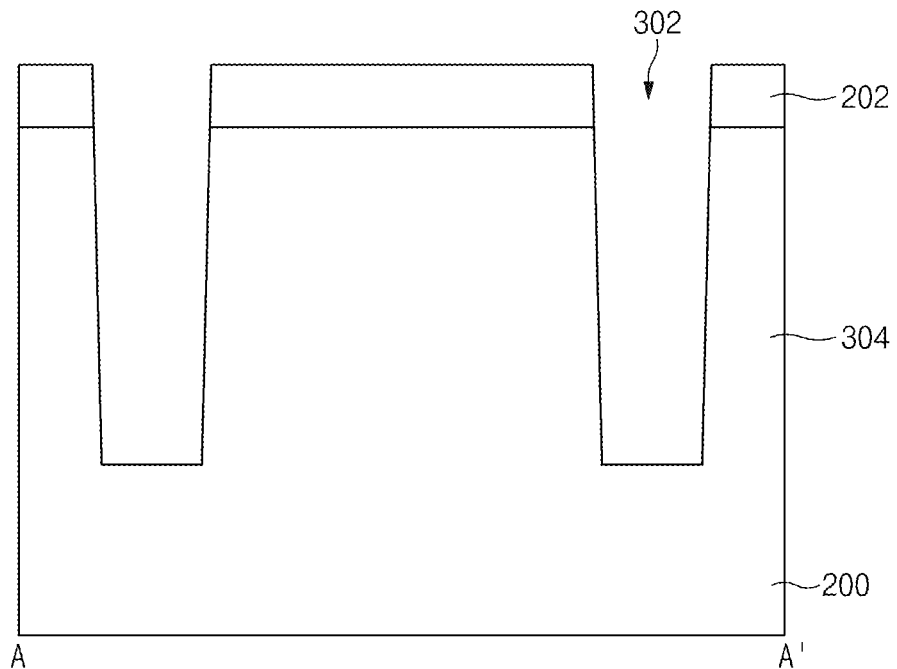
FIGS. 20 to 25 are cross-sectional views illustrating a method for forming the semiconductor device shown in FIG. 19.

Referring to FIG. 20, a device isolation film (not shown) including a sacrificial film (not shown) is formed as shown in FIGS. 2A and 2C, resulting in formation of a line-type active region, as shown in FIG. 2B.

Subsequently, as shown in FIGS. 3A and 3B, a hard mask pattern 202, and the line-type active region, and the device isolation film are etched using an ISO cut mask, resulting in formation of a line-type device isolation trench 302. By the device isolation trench 302, the line-type active region is divided into a plurality of island-type active regions 304 each having a predetermined length in a direction corresponding to a line A-A'. In an embodiment, the device isolation trench 302 may have a depth greater than that of the device isolation trench 208 of FIG. 3B.

Figure 21:
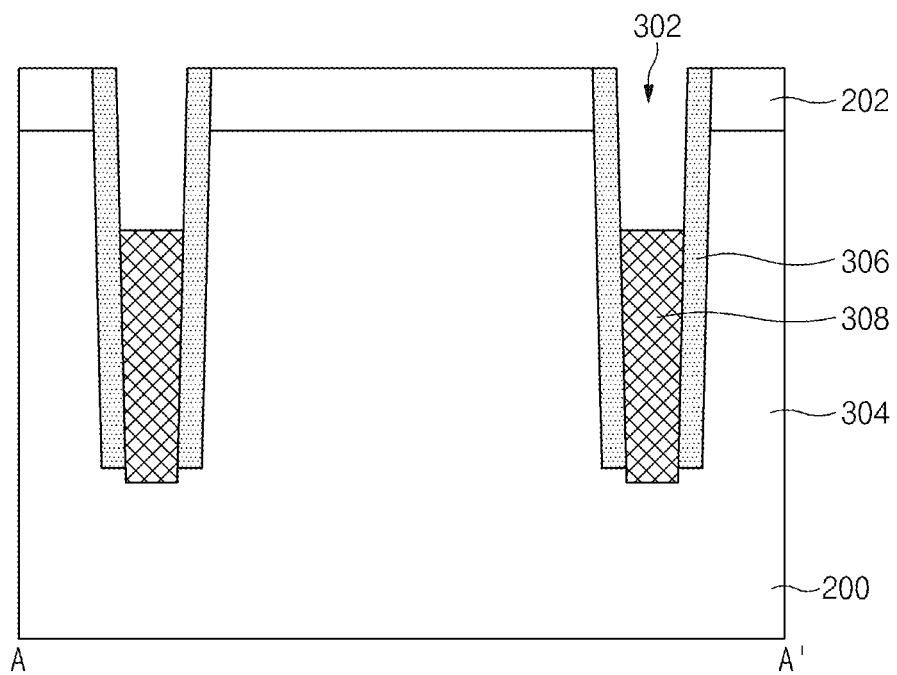

Referring to FIG. 21, a spacer 306 is formed on a sidewall of the device isolation trench 302. In an embodiment, the spacer 306 may include an oxide film.

Subsequently, a conductive film is formed to fill the device isolation trench 302, and then the conductive film is etched back. As a result, a lower body-tied structure 308 having a predetermined height is formed in a lower portion of the device isolation trench 302. In an embodiment, the conductive film for forming the lower body-tied structure 308 may include a doped polysilicon material. In another embodiment, a portion of a semiconductor substrate 200 under the device isolation trench 302 is partially etched using the spacer 306 as a barrier film. As a result, a lower surface of the lower body-tied structure 308 is disposed below the bottom of the spacer 306, as shown in FIG. 21.

Figure 22:
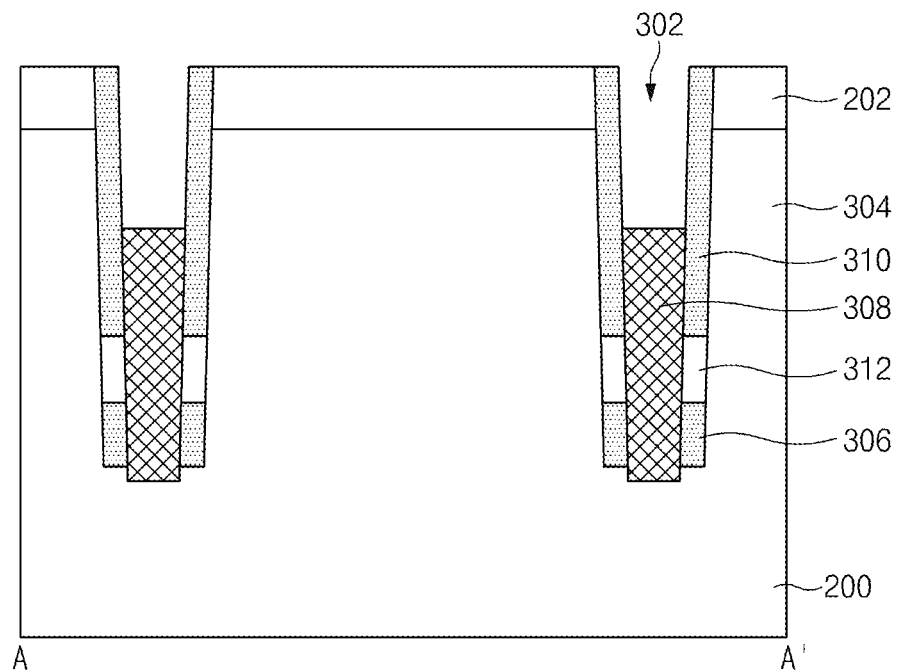

Referring to FIG. 22, the spacer 306 is partially etched in such a manner that the spacer 306 remains only at a lower portion of the device isolation trench 302. In an embodiment, the spacer 306 may be etched by a strip process.

Subsequently, an insulation film (not shown) is formed not only on a sidewall of the device isolation trench 302 but also on a top surface of the lower body-tied structure 308, and then the insulation film is etched back, resulting in formation of a spacer 310 remaining on the sidewall of the device isolation trench 302. The insulation film for the spacer 310 may include an Ultra Low Temperature Oxide (ULTO) film. In this embodiment, when the insulation film is formed on the sidewall of the device isolation trench 302 and on the top surface of the lower body-tied structure 308, some parts of spaces from which the spacer 306 is removed are not filled with the insulation film. As a result, an air gap 312 is formed between the lower body-tied structure 308 and the island-type active region 304 to enclose a middle portion of the lower body-tied structure 308.

Figure 23:
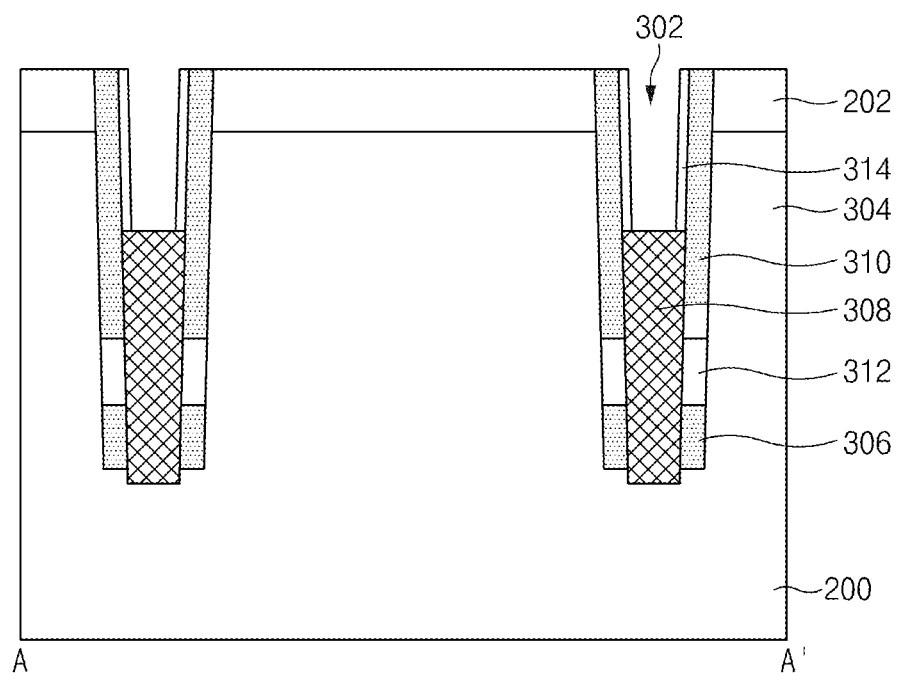

Referring to FIG. 23, an insulation film is formed not only on an exposed sidewall of the spacer 310 but also on a top surface of the lower body-tied structure 308, and then the insulation film is etched back to remove the insulation film formed on the lower body-tied structure 308, resulting in formation of a spacer 314. In an embodiment, the insulation film for the spacer 314 may include a nitride film.

Figure 24:
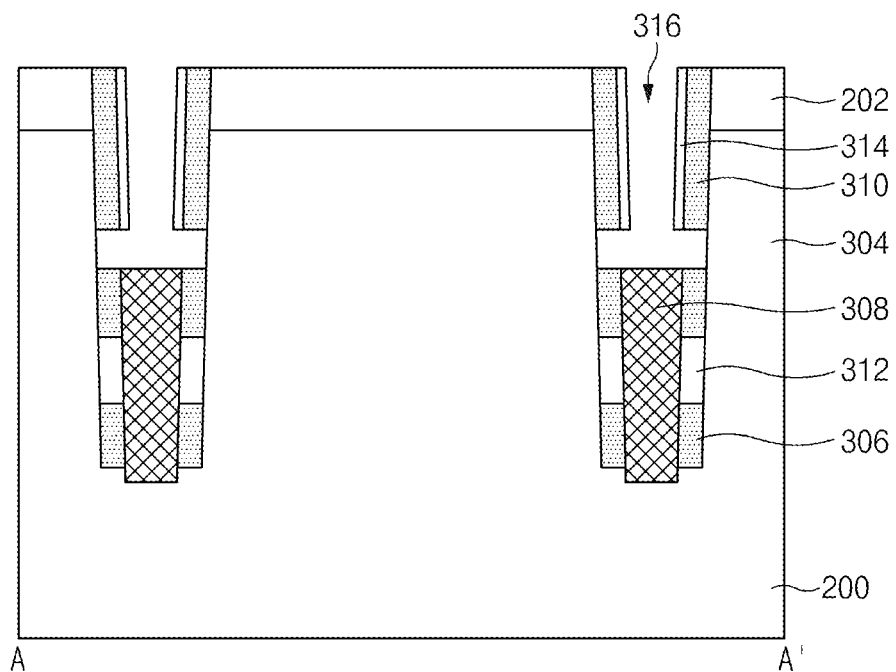

Referring to FIG. 24, an upper portion of the lower body-tied structure 308 is partially etched using the spacer 314 as a barrier film, so that a part of a sidewall of the spacer 310 is exposed. The upper portion of the lower body-tied structure 308 is etched not to expose the air gap 312. Subsequently, the exposed spacer 310 is etched by a cleaning process based on the etch selectivity of the spacers 310 and 314. As a result, a trench 316 is formed to expose part of sidewalls of the active regions 304 located at both sides of the lower body-tied structure 308.

Figure 25:
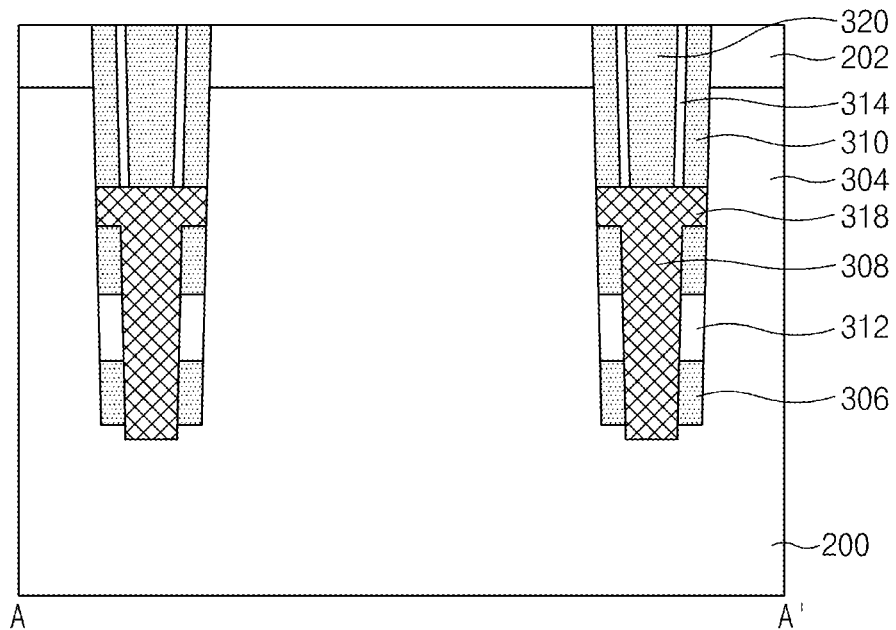

Referring to FIG. 25, a conductive film is formed to fill the trench 316, and then the conductive film is etched back so that a BSC-shaped upper body-tied structure 318 for connecting the lower body-tied structure 308 to two neighboring active regions 304 disposed at both sides of the lower body-tied structure 308 is formed. In an embodiment, the conductive film for forming the upper body-tied structure 318 may include doped polysilicon that is the same material as that of the lower body-tied structure 308. As a result, a body-tied structure having a cross section of a 'T' shape is formed.

Subsequently, an insulation film 320 is formed over the upper body-tied structure 318 so as to fill the remaining portion of the trench 316, and the insulation film 320 is planarized. In an embodiment, the insulation film 320 may include an oxide film. Subsequent processes are substantially identical to those described with reference to FIGS. 10A to 18C, and thus a detailed description thereof will be omitted herein for the simplicity of explanation.

Figure 26A:
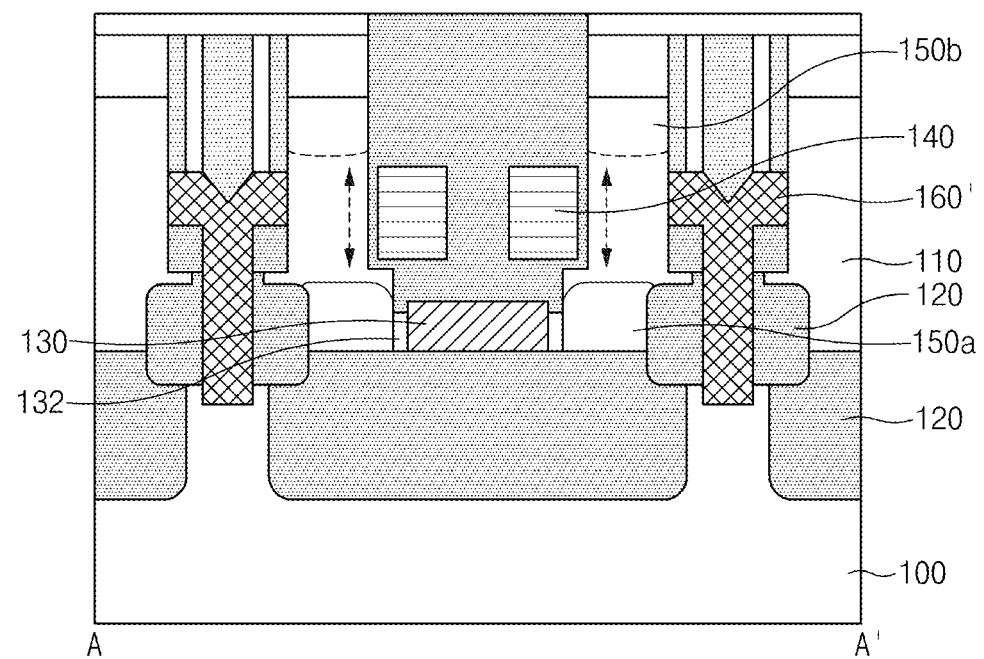
FIGS. 26A and 26B are cross-sectional views illustrating semiconductor devices according to other embodiments.
Figure 26B:
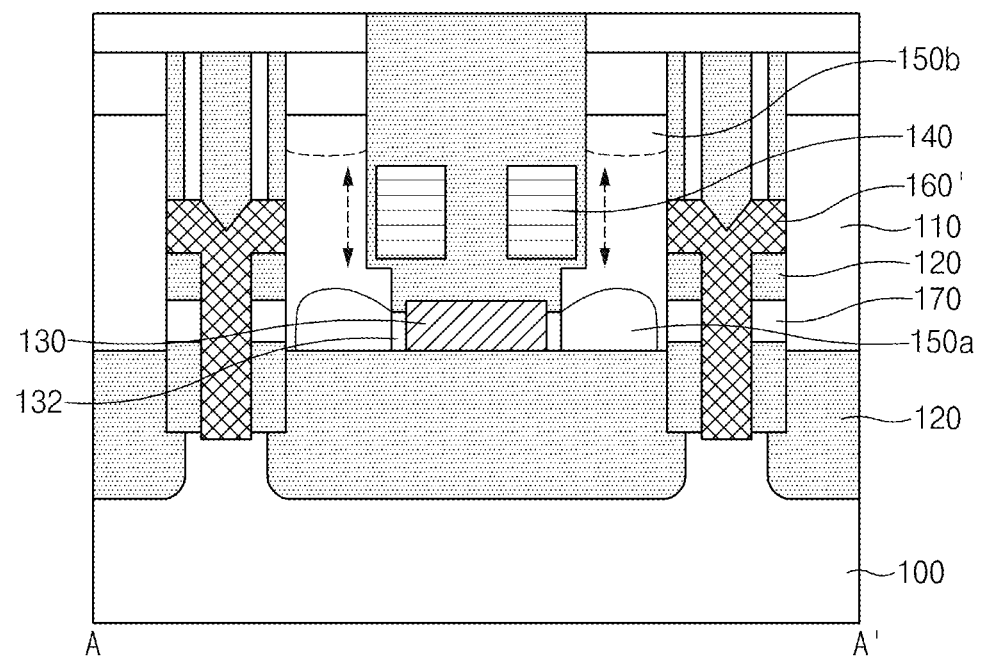

FIGS. 26A and 26B are cross-sectional views illustrating semiconductor devices according to other embodiments.

While the body-tied structure 160 shown in the embodiments of FIGS. 1B and 19 has a cross-section of a 'T' shape, a body-tied structure 160' shown in embodiments of FIGS. 26A and 26B has a cross-section of a 'Y' shape. However, embodiments are not limited thereto.

In FIGS. 26A and 26B, since other structures than the body-tied structure 160' are substantially identical to those of FIGS. 1B and 19, a detailed description thereof will be omitted herein for the simplicity of explanation.

Figure 27:
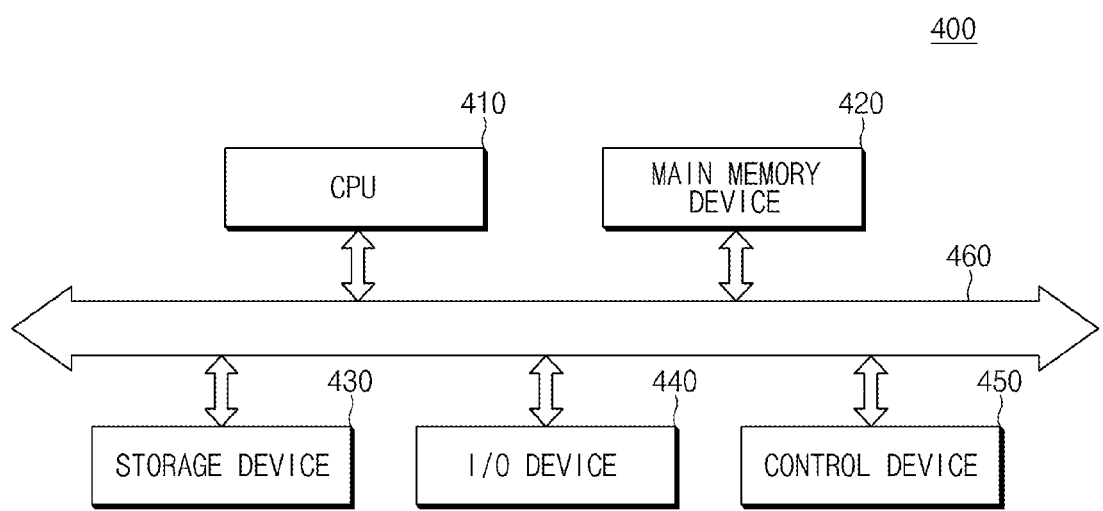
FIG. 27 is a block diagram illustrating a processor system according to an embodiment.

FIG. 27 is a block diagram illustrating a processor system according to an embodiment.

Referring to FIG. 27, the processor system 400 may include a central processing unit (CPU) 410, a main memory device 420, a storage device 430, an input/output (I/O) device 440, and a control device 450. Information and data may be transmitted through a system bus 460 among the CPU 410, the main memory device 420, the storage device 430, the I/O device 440, and the control device 450.

The CPU 410 may execute programs stored in the processor system 400, and may perform data processing for the programs. For example, the CPU 410 may include a register, an Arithmetic Logic Unit (ALU), a control device, or the like. The CPU 410 may unidirectionally transmit an address, data, or information associated with a control signal to the main memory device 420, the storage device 430, or the I/O unit 440. Alternatively, the address, data, or information associated with the control signal may be bidirectionally transmitted between the CPU 410 and at least one of the main memory device 420, the storage device 430, and the I/O unit 440.

The main memory device 420 may store data to be processed by the CPU 410, or may store resultant data processed by the CPU 410. In addition, the main memory device 420 may store data received from the I/O device 440, or may also store data to be output to the I/O device 440. In an embodiment, the main memory device 420 may include a volatile memory such as a dynamic random access memory (DRAM).

The main memory device 420 may include a plurality of cells configured to store data in units of a bit. The main memory device 420 may include at least one of a semiconductor device including the constituent elements of FIGS. 1A to 1C, a semiconductor device including the constituent elements of FIG. 19, and a semiconductor device including the constituent elements of FIG. 26A or 26B. In an embodiment, in a semiconductor device of the main memory device 420, one sidewall of an active pillar may be coupled to a substrate through a body-tied structure, and other sidewalls of the active pillar may be enclosed by a gate. A cross-section of the body-tied structure may have a 'T' shape or 'Y' shape. In addition, a bit line may have a BBL (Buried Bit Line) structure located below the gate, and an air gap may be formed between neighboring bit lines. An air gap may also be formed between the body-tied structure and the active pillar.

For facilitation of functions of the main memory device 420, the storage device 430 may separately store data therein. For example, after the storage device 430 stores data to be processed in the main memory device 420, the storage device 430 may provide a necessary amount of data to the main memory device 420 as necessary. The storage device 430 may include a magnetic tape, a magnetic disc such as a floppy disc or hard disc, a Compact Disc Read Only Memory (CD-ROM), an optical disc such as a laser disc or Digital Versatile Disc (DVD), a flash memory, a Solid State Disc (SSD), a Universal Serial Bus (USB) memory, a Secure Digital (SD) card, a mini Secure Digital (mSD) card, a micro SD card, a high-capacity Secure Digital High Capacity (SDHC), a Memory Stick Card, a Smart Media (SM) card, a Multi Media Card (MMC), an Embedded MMC (eMMC), a Compact Flash (CF) card, or the like.

The I/O device 440 may be configured to input data to be processed by the CPU 410 as well as to output data processed by the CPU 410. The I/O device 440 may include a keypad, a keyboard, a mouse, a speaker, a microphone, a display, a printer, interface devices such as a graphic card, a communication device, or the like. The communication device may include a module coupled to a wired network, a module coupled to a wireless network, or a combination thereof. The wired network module may include a device capable of performing data communication through a transmission line, for example, a Local Area Network (LAN), a Universal Serial Bus (USB), an Ethernet, a Power Line Communication (PLC), or the like. The wireless network module may include a device capable of performing data communication without using the transmission line, for example, an Infrared Data Association (IrDA), a Wireless LAN, a Zigbee, a Ubiquitous Sensor Network (USN), a Bluetooth, a Radio Frequency Identification (RFID), a Near Field Communication (NFC), a Wireless Broadband Internet (Wibro), or the like.

The control device 450 may control transmission of data or signals between the CPU 410 and other devices 420, 430, and 440. The control device 450 may be a north-bridge chip or south-bridge chip included in a computer.

The system bus 460 may be used as a signal transmission path among the CPU 410, the main memory device 420, the storage device 430, the I/O device 440, and the control device 450. In an embodiment, the system bus 450 may include an address bus, a data bus, and a control bus.

The processor system of FIG. 27 may include a main board such as a printed circuit board (PCB). The main board may hold the CPU 410, the main memory device 420, and the control device 450. For example, the CPU 410 or the control device 450 may be implemented in a single semiconductor package and be accommodated in the main board. The main board may be a multi-layered circuit board. The storage device 430 and the I/O device 440 may be fabricated as separate products, and may be coupled to an I/O interface device disposed on the main board. The system bus 460 may be implemented by integrated circuits (ICs) included in the main memory device 420, the storage device 430, the I/O device 440, the control device 450, and the CPU 410, or may be implemented by an IC included in the main board.

In conclusion, the processor system according to this embodiment may include a semiconductor package having the inventive semiconductor device, or may include a main memory device equipped with a package module including the semiconductor package. Accordingly, the floating body effect may be prevented from occurring in the main memory device, and thus it is possible to reduce parasitic capacitance generated between neighboring bit lines and to improve electrical characteristics of the main memory device. As a result, the reliability of data can be improved, and the entire performance of the processor system can be improved.

Figure 28:
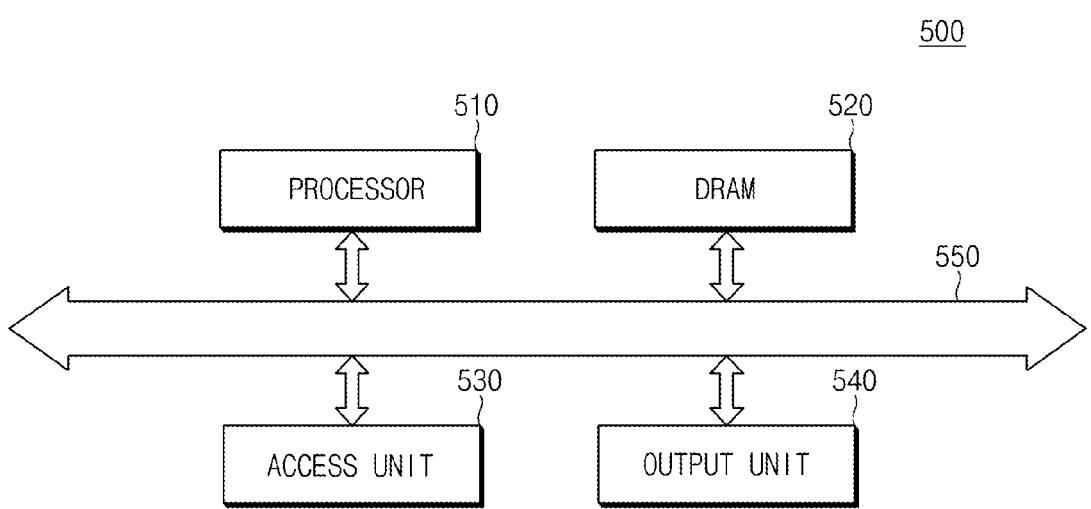
FIG. 28 is a block diagram illustrating an electronic device according to an embodiment.

FIG. 28 is a block diagram illustrating an electronic device according to an embodiment.

Referring to FIG. 28, the electronic device 500 may include a processor 510, a DRAM 520, an access unit 530, and an output unit 540. Information and data may be transmitted through a system bus 550 among the processor 510, the memory unit 520, the access unit 530, and the output unit 540.

The processor 510 may process a variety of images or video signals. The processor 510 may include a Graphics Processing Unit (GPU).

The DRAM 520 may store video data processed by the processor 510. The DRAM 520 may include a plurality of cells configured to store video data in units of a bit. The DRAM 520 may have the structure of FIGS. 1A to 1C, the structure of FIG. 19, or the structure of FIG. 26A or 26B. Therefore, in the DRAM 520, one sidewall of an active pillar is coupled to a substrate through a body-tied structure, and other sidewalls may be enclosed by a gate. A cross-section of the body-tied structure may have a 'T' shape or 'Y' shape. A bit line may have a buried bit line (BBL) structure located blow the gate, and an air gap may be formed between neighboring bit lines. In addition, an air gap may be formed between the body-tied structure and the active pillar.

The access unit 530 acting as an interface device may couple the electronic device 500 to an external processor system such as a computer system, so that control signals and data can be transmitted between the access unit 530 and a CPU of the external processor system. The access unit 530 may include an AGP scheme or a PCI scheme.

The output unit 540 may output processed video data to an output device such as a display.

The electronic device 500 of FIG. 28 may be implemented as a graphic card, and may include a main board such as a printed circuit board (PCB). In an embodiment, the main board may hold the processor 510 and the DRAM 520. In an embodiment, the processor 510 or the DRAM 520 may be implemented in a single semiconductor package, and then be accommodated in the main board. The main board may be a multi-layered circuit board.

Each of the access unit 530 and the output unit 540 may include an input/output (I/O) interface device arranged on the main board. The system bus 550 may be implemented by an IC included in the processor 510, the DRAM 520, the access unit 530, or the output unit 540, or may be implemented by an IC included in the main board.

In conclusion, the electronic device (graphic card) according to this embodiment may include a DRAM including the inventive semiconductor device. As a result, since the floating body effect may be prevented from occurring in the DRAM, it is possible to reduce parasitic capacitance generated between neighboring bit lines and to improve electrical characteristics of the main memory device. The reliability of data can be improved, and thus the entire performance of the process system can also be improved.

Figure 29:
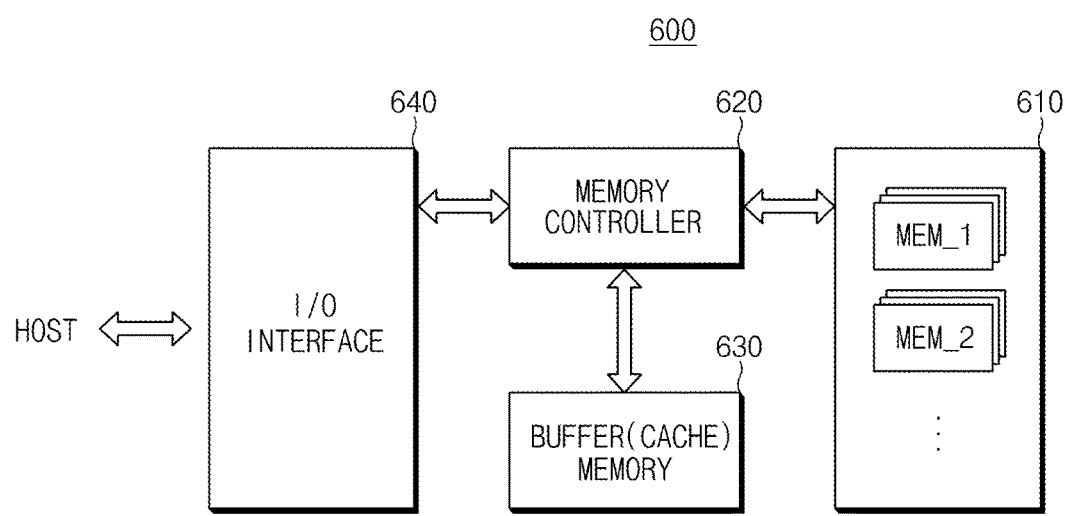
FIG. 29 is a block diagram illustrating an electronic device according to another embodiment.

FIG. 29 is a block diagram illustrating an electronic device according to another embodiment.

Referring to FIG. 29, the electronic device 600 may include a data storage unit 610, a memory controller 620, a buffer (cache) memory 630, and an I/O interface 640.

The data storage unit 610 may store data (DATA) received from the memory controller 620 upon receiving a control signal from the memory controller 620, read stored data (DATA), and output the read data to the memory controller 620. The data storage unit 610 may include at least one non-volatile memory storing data unchanged even when not powered, for example, a Nor Flash Memory, a NAND Flash Memory, a Phase Change Random Access Memory (PRAM), a Resistive Random Access Memory (RRAM), a Spin Transfer Torque Random Access Memory (STTRAM), a Magnetic Random Access Memory (MRAM), or the like.

The memory controller 620 may decode a command received from an external device (e.g., host device) through the I/O interface 640, and may control data I/O operations of the data storage unit 610 and the buffer memory 630. Although the memory controller 620 is denoted by one block as shown in FIG. 29 for convenience of description, the memory controller 620 may include a first controller for controlling the data storage unit 610 and a second controller for controlling the buffer memory 630 including a volatile memory. In an embodiment, the first controller and the second controller may be arranged independently from each other.

The buffer memory 630 may temporarily store data to be processed by the memory controller 620. In other words, the buffer memory 630 may temporarily store data to be input/output to/from the data storage unit 610. The buffer memory 630 may store data (DATA) received from the memory controller 620 upon receiving a control signal from the memory controller 620, read stored data, and output the read data to the memory controller 620. The buffer memory 630 may include a volatile memory, for example, a Dynamic Random Access Memory (DRAM), a Mobile DRAM, a Static Random Access Memory (SRAM), or the like.

The I/O interface 640 may provide a connection between the memory controller 620 and an external device (e.g., host device), such that the I/O interface 640 may control the memory controller 620 to receive data I/O control signals from the external device as well as to exchange data with the external device. The I/O interface 640 may include at least one of various interface protocols including a universal serial bus (USB) protocol, a multimedia card (MMC) protocol, a peripheral component interconnection (PCI) protocol, a PCI-express (PCI-E) protocol, a serial attached SCSI (SAS), a serial ATA (SATA) protocol, a parallel advanced technology attachment (PATA) protocol, a small computer small interface (SCSI) protocol, an enhanced small disk interface (ESDI) protocol, an integrated drive electronics (IDE) protocol, and so on.

In the electronic device 600, the data storage unit 610 or the buffer memory 630 may include a semiconductor device having the structure of FIG. 1B, the structure of FIG. 19, or the structure of FIG. 26A or 26B. Therefore, in the semiconductor device of the data storage unit 610 or the buffer memory 630, one sidewall of an active pillar may be coupled to a substrate through a body-tied structure, and other sidewalls may be enclosed by a gate. A cross-section of the body-tied structure may have a 'T' shape or 'Y' shape. In addition, a bit line may have a BBL (Buried Bit Line) structure located below the gate, and an air gap may be formed between neighboring bit lines. An air gap may also be formed between the body-tied structure and the active pillar.

The electronic device 600 of FIG. 29 may be used as an auxiliary memory device of a host device or an external storage device. The memory system 600 may include a Solid State Disc (SSD), a Universal Serial Bus (USB) memory, a Secure Digital (SD) card, a mini Secure Digital (mSD) card, a micro SD card, a high-capacity Secure Digital High Capacity (SDHC), a Memory Stick Card, a Smart Media (SM) card, a Multi Media Card (MMC), an Embedded MMC (eMMC), a Compact Flash (CF) card, or the like.

In conclusion, the electronic device according to this embodiment may include a data storage unit including the inventive semiconductor device. As a result, since the floating body effect may be prevented from occurring in the semiconductor device, it is possible to reduce parasitic capacitance generated between neighboring bit lines, and to improve electrical characteristics of the electronic device. Accordingly, the entire performance of the electronic device can be improved.

Figure 30:
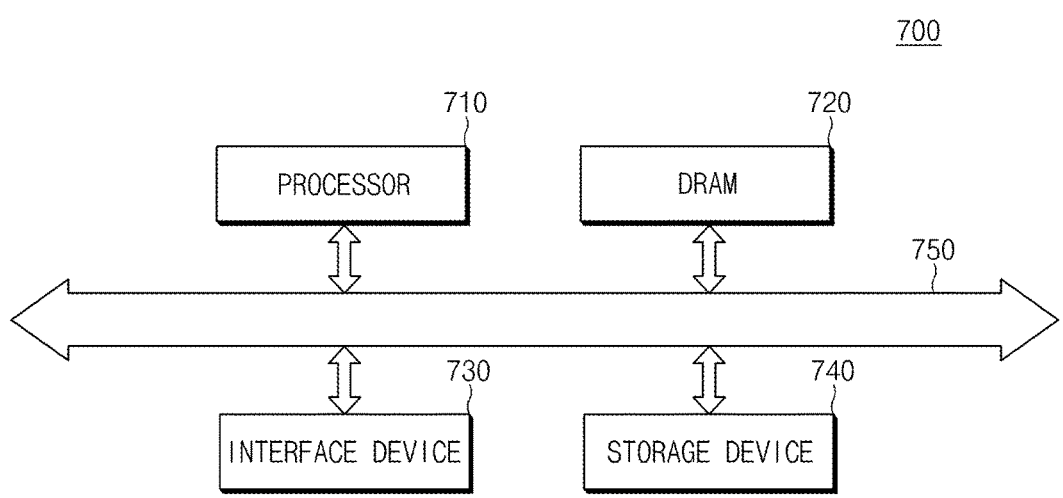
FIG. 30 is a block diagram illustrating an electronic system according to an embodiment.

FIG. 30 is a block diagram illustrating an electronic system according to an embodiment.

Referring to FIG. 30, the electronic system 700 may include a processor 710, a DRAM 720, an interface device 730, and a storage device 740. Information and data may be transmitted through a system bus 750 among the processor 710, the DRAM 720, the interface device 730, and the storage device 740.

The processor 710 may perform a variety of operations according to categories of the electronic system 700, and may control other constituent elements 720, 730, and 740 of the electronic system 700. For example, the processor 710 may execute programs stored in the electronic system 700, or may perform a variety of operations requested by the electronic system 700.

The DRAM 720 may receive data to be processed by the processor 710 from the storage device 740, store the received data, or temporarily store resultant data processed by the processor 710. The DRAM 720 may be used as a buffer configured to increase a processing speed of the processor 710.

The DRAM 720 may include a plurality of cells configured to store data in units of a bit. The DRAM 720 may include a semiconductor device having the structure of FIGS. 1A to 1C, the structure of FIG. 19, or the structure of FIG. 26A or 26B. Therefore, in the semiconductor device of the DRAM 720, one sidewall of an active pillar may be coupled to a substrate through a body-tied structure, and other sidewalls may be enclosed by a gate. A cross-section of the body-tied structure may have a 'T' shape or 'Y' shape. In addition, a bit line may have a BBL (Buried Bit Line) structure located below the gate, and an air gap may be formed between neighboring bit lines. An air gap may also be formed between the body-tied structure and the active pillar.

The interface device 730 may transmit and receive a control signal or data of an external device to and from the electronic system 700, and may include any of various display devices, an audio device, a microphone, a touchscreen, a keypad, a keyboard, a mouse, a user interface, a variety of wired/wireless communication devices, and the like.

The storage device 740 may store data to be processed by the processor 710, or may store data processed by the processor 710. The storage device 740 may have non-volatile characteristics, and may sequentially provide data to be processed by the processor 710 in cooperation with the DRAM 720. In some embodiments, the electronic system 700 may not include the storage device 740, and may include the processor 710, the DRAM 720, and the interface device 730 only.

The electronic system 700 may include a main board such as a printed circuit board (PCB). The processor 710 or the DRAM 720 may be implemented in a single semiconductor package and be accommodated in the main board. The DRAM 720 may be configured in the form of a package module and be coupled to the main board. The interface device 730 or the storage device 740 may be fabricated as a separate product and may be coupled to the electronic system 700, so that the interface device 730 or the storage device 740 may transmit and receive signals to and from the main board. The system bus 750 may be implemented by integrated circuits (ICs) included in the processor 710, the DRAM 720, the interface device 730, or the storage device 740, or may be implemented by an IC included in the main board.

The electronic system 700 of FIG. 30 may include one or more systems configured to operate using processors, for example, a personal computer (PC), a server, a personal digital assistant (PDA), a portable computer, a Web tablet, a wireless phone a mobile phone, a smart phone, a digital music player, a portable multimedia player (PMP), an enterprise digital assistant (EDA), a digital still camera, a digital video camera, a Global Positioning System (GPS), a voice recorder, a Telematics, an Audio Visual (AV) System, a Smart Television, other embedded systems, etc.

In conclusion, the electronic system according to this embodiment may include a DRAM including the inventive semiconductor device. As a result, since the floating body effect may be prevented from occurring in the DRAM, it is possible to reduce parasitic capacitance generated between neighboring bit lines, and to improve electrical characteristics of the DRAM. Accordingly, the reliability of data can be improved and the entire performance of the electronic system can also be improved.

As is apparent from the above description, the vertical-channel semiconductor device according to the embodiments can prevent the floating body effect from occurring therein.

In addition, the vertical-channel semiconductor device according to the embodiments can reduce parasitic capacitance between neighboring buried bit lines.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

The above embodiments of the present disclosure are illustrative and not limitative. Various alternatives and equivalents are possible. The present invention is not limited by embodiments described herein. Nor are embodiments limited to any specific type of semiconductor device. For example, the embodiments of the present disclosure may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a first active pillar and a second active pillar, each having a channel region arranged in a direction perpendicular to a major surface of a substrate;
   an insulation film defining the first active pillar and the second active pillar, and electrically isolating the first active pillar and the second active pillar from the substrate;
   a first gate disposed between the first active pillar and the second active pillar, and disposed adjacent to side surfaces of the first active pillar;
   a second gate disposed between the first active pillar and the second active pillar, and disposed adjacent to side surfaces of the second active pillar; and
   a bit line disposed below the first gate and the second gate, and coupled to and disposed between the first active pillar and the second active pillar.

2. The semiconductor device according to claim 1, further comprising:
   a first body-tied structure coupling a side surface of the first active pillar to the substrate, the first body-tied structure including a conductive material; and
   a second body-tied structure coupling a side surface of the second active pillar to the substrate, the second body-tied structure including a conductive material.

3. The semiconductor device according to claim 2, wherein each of the first body-tied structure and the second body-tied structure has a pillar shape.

4. The semiconductor device according to claim 2, further comprising:
   a first air-gap disposed between the first body-tied structure and the first active pillar; and
   a second air-gap disposed between the second body-tied structure and the second active pillar.

5. The semiconductor device according to claim 4, further comprising:
   a third air-gap buried in the insulation film and disposed between neighboring bit lines.

6. The semiconductor device according to claim 2, wherein a cross-section of the first body-tied structure has a T shape or Y shape.

7. The semiconductor device according to claim 1, wherein each of the first active pillar and the second active pillar includes 4 side surfaces, and
   wherein the first gate is provided over 3 side surfaces of the 4 side surfaces of the first active pillar, and the second gate is provided over 3 side surfaces of the 4 side surfaces of the second active pillar.

8. A semiconductor device comprising:
   an active pillar;
   a gate disposed adjacent to side surfaces of the active pillar;
   an insulation film electrically isolating the active pillar from the substrate;
   a buried bit line disposed between the insulation film and the gate, and coupled to a lower portion of the active pillar; and
   a body-tied structure having a pillar shape, and coupling the active pillar to the substrate.

9. The semiconductor device according to claim 8, wherein the active pillar is a first active pillar, the device further comprising:
   a second active pillar being provided at an opposing side of the first active pillar with respect to the body-tied structure,
   wherein the insulation film electrically isolates the second active pillar from the substrate, and
   wherein the body-tied structure has a Both Side Contact (BSC) structure configured to couple the first and second active pillars to the substrate.

10. The semiconductor device according to claim 9, wherein a cross-section of the body-tied structure has a T shape or Y shape.

11. The semiconductor device according to claim 9, wherein the body-tied structure includes:
    an upper structure coupled to the first and second active pillars; and
    a lower structure coupling the upper structure to the substrate.

12. The semiconductor device according to claim 8, wherein the active pillar includes 4 side surfaces, and
    wherein the gate is provided over 3 side surfaces of the 4 side surfaces of the active pillar.

13. The semiconductor device according to claim 8, further comprising:
    a first air-gap disposed between the body-tied structure and the active pillar.

14. The semiconductor device according to claim 13, further comprising:
    a second air-gap disposed between the buried bit line and a buried bit line provided adjacent thereto.

15. The semiconductor device according to claim 7, further comprising:
    a first body-tied structure coupling the other side surface of the 4 side surfaces of the first active pillar to the substrate; and
    a second body-tied structure coupling the other side surface of the 4 side surfaces of the second active pillar to the substrate.

16. The semiconductor device according to claim 12, wherein the body-tied structure couples the other side surface of the 4 side surfaces of the active pillar to the substrate.

* * * * *